United States Patent
Heitzinger et al.

(10) Patent No.: US 7,977,173 B2
(45) Date of Patent: Jul. 12, 2011

(54) SILICON THIN FILM TRANSISTORS, SYSTEMS, AND METHODS OF MAKING SAME

(75) Inventors: John M. Heitzinger, St. Louis Park, MN (US); John Snyder, Edina, MN (US)

(73) Assignee: Soligie, Inc., Savage, MN (US)

( * ) Notice: Subject to any disclaimer, the term of this patent is extended or adjusted under 35 U.S.C. 154(b) by 192 days.

(21) Appl. No.: 12/359,929

(22) Filed: Jan. 26, 2009

(65) Prior Publication Data

US 2009/0191670 A1    Jul. 30, 2009

Related U.S. Application Data

(60) Provisional application No. 61/023,418, filed on Jan. 24, 2008.

(51) Int. Cl.
*H01L 21/84* (2006.01)

(52) U.S. Cl. ........ 438/151; 438/149; 438/164; 438/694; 257/E21.704; 257/288; 257/E29.273

(58) Field of Classification Search ................ 438/151, 438/149, 164, 694; 257/E21.704, 288, E29.273, 257/40, E51.046, E21.24, 369, E27.062
See application file for complete search history.

(56) References Cited

U.S. PATENT DOCUMENTS

| | | | |
|---|---|---|---|
| 4,177,372 A | 12/1979 | Kotera et al. | |
| 4,409,724 A | 10/1983 | Tasch, Jr. et al. | |
| 5,085,904 A * | 2/1992 | Deak et al. | 428/35.7 |
| 5,346,850 A | 9/1994 | Kaschmitter et al. | |
| 5,395,481 A | 3/1995 | McCarthy | |
| 5,399,231 A | 3/1995 | McCarthy | |
| 5,414,276 A | 5/1995 | McCarthy | |
| 5,817,550 A | 10/1998 | Carey et al. | |
| 6,436,739 B1 * | 8/2002 | Wickboldt et al. | 438/149 |
| 6,555,411 B1 * | 4/2003 | Bao et al. | 438/99 |
| 6,566,805 B1 * | 5/2003 | Tsai et al. | 313/504 |
| 6,576,294 B1 * | 6/2003 | Phillips et al. | 427/255.5 |
| 6,709,905 B2 * | 3/2004 | Kusumoto et al. | 438/161 |
| 6,737,710 B2 | 5/2004 | Cheng et al. | |
| 6,756,604 B2 | 6/2004 | Kovacic et al. | |
| 6,842,657 B1 * | 1/2005 | Drzaic et al. | 700/120 |

(Continued)

FOREIGN PATENT DOCUMENTS

EP    1 732 115 A1    12/2006

(Continued)

OTHER PUBLICATIONS

High Temperature Polycrystalline Silicon Thin Film Transistor on Steel Substrates, Wu et al., Electron Devices Meeting, 1999; IEDM Technical Digest; International; pp. 119-122 (1999).

(Continued)

*Primary Examiner* — N Drew Richards
*Assistant Examiner* — Ankush K Singal
(74) *Attorney, Agent, or Firm* — Patterson Thuente Christensen Pedersen, P.A.

(57) ABSTRACT

Systems and methods of fabricating silicon-based thin film transistors (TFTs) on flexible substrates. The systems and methods incorporate and combine deposition processes such as chemical vapor deposition and plasma-enhance vapor deposition, printing, coating, and other deposition processes, with laser annealing, etching techniques, and laser doping, all performed at low temperatures such that the precision, resolution, and registration is achieved to produce a high performing transistor. Such TFTs can be used in applications such as displays, packaging, labeling, and the like.

24 Claims, 22 Drawing Sheets

U.S. PATENT DOCUMENTS

| | | |
|---|---|---|
| 6,844,128 B2 | 1/2005 | Hsu et al. |
| 7,001,658 B2 | 2/2006 | Bourdelais et al. |
| 7,105,390 B2 * | 9/2006 | Brask et al. .................... 438/149 |
| 7,141,348 B2 | 11/2006 | Sheats et al. |
| 7,195,950 B2 * | 3/2007 | Taussig ........................ 438/100 |
| 7,198,879 B1 | 4/2007 | Tredwell et al. |
| 7,259,106 B2 * | 8/2007 | Jain .............................. 438/737 |
| 7,307,273 B2 | 12/2007 | Currie |
| 7,361,594 B2 * | 4/2008 | Kawase et al. ................ 438/678 |
| 7,541,225 B2 * | 6/2009 | Baek et al. .................... 438/149 |
| 7,678,626 B2 * | 3/2010 | Perlov et al. .................. 438/158 |
| 7,718,009 B2 * | 5/2010 | Verhaverbeke et al. .......... 134/3 |
| 2002/0068390 A1 * | 6/2002 | Gosain et al. ................. 438/149 |
| 2002/0115201 A1 * | 8/2002 | Barenburg et al. ........ 435/306.1 |
| 2002/0132482 A1 * | 9/2002 | Chou ............................ 438/692 |
| 2002/0182890 A1 * | 12/2002 | Ishida et al. .................. 438/780 |
| 2002/0192884 A1 * | 12/2002 | Chang et al. .................. 438/164 |
| 2003/0211261 A1 * | 11/2003 | Phillips et al. ............... 428/35.7 |
| 2005/0042860 A1 | 2/2005 | Daniels et al. |
| 2005/0058785 A1 | 3/2005 | Uhlig et al. |
| 2005/0112870 A1 * | 5/2005 | Park .............................. 438/647 |
| 2005/0176182 A1 * | 8/2005 | Me et al. ....................... 438/149 |
| 2005/0214672 A1 | 9/2005 | Blanchet-Fincher |
| 2005/0215070 A1 * | 9/2005 | Kobayashi .................... 438/770 |
| 2005/0233491 A1 | 10/2005 | Hirai |
| 2006/0160276 A1 | 7/2006 | Brown et al. |
| 2006/0181600 A1 | 8/2006 | Bourdelais et al. |
| 2006/0183342 A1 | 8/2006 | Bruyns et al. |
| 2006/0243377 A1 | 11/2006 | Matsuo et al. |
| 2006/0249301 A1 | 11/2006 | Meth |
| 2006/0263725 A1 | 11/2006 | Nguyen et al. |
| 2006/0286785 A1 | 12/2006 | Rogers et al. |
| 2007/0009827 A1 | 1/2007 | Sheats et al. |
| 2007/0077511 A1 | 4/2007 | Tredwell et al. |
| 2007/0105393 A1 | 5/2007 | Cheng |
| 2007/0161163 A1 | 7/2007 | Hirai |
| 2007/0178403 A1 | 8/2007 | Caspar |
| 2007/0178672 A1 | 8/2007 | Tanaka et al. |
| 2007/0210311 A1 | 9/2007 | Ando et al. |
| 2007/0284573 A1 * | 12/2007 | Tseng et al. .................... 257/43 |
| 2008/0042212 A1 | 2/2008 | Kamath et al. |
| 2008/0044964 A1 | 2/2008 | Kamath et al. |
| 2008/0092377 A1 | 4/2008 | Heitzinger |
| 2009/0189204 A1 | 7/2009 | Heitzinger et al. |

FOREIGN PATENT DOCUMENTS

| | | |
|---|---|---|
| JP | 2002-353238 A | 12/2002 |
| WO | WO 2005/122285 A2 | 12/2005 |
| WO | WO 2006/043690 A1 | 4/2006 |
| WO | WO 2007/029028 A1 | 3/2007 |
| WO | WO 2007/035357 A2 | 3/2007 |
| WO | WO 2007/057664 A2 | 5/2007 |

OTHER PUBLICATIONS

100 MHz CMOS Circuits using Sequential Laterally Solidified Silicon Thin-Film Transistors on Plastic, Kane et al., IEDM Technical Digest; IEEE International; vol. Issue 5-5; pp. 939-941 (Dec. 2005).

Boron Doped Polycrystalline Silicon Produced by Step-by-Step XeC1 Excimer Laser Crystallization, Saleh et al., Mater. Res. Soc. Symp. Proc. vol. 910 (2006).

Novel Processes for Poly-Si Thin-Film Transistors on Plastic Substrates, Daniel Albert Good, Dissertation; University of California, Berkeley (2007).

U.S. Office Action dated Mar. 14, 2011 from U.S. Appl. No. 12/359,922.

\* cited by examiner

SILICON THIN FILM TRANSISTORS, SYSTEMS, AND METHODS OF MAKING SAME

RELATED APPLICATION

This application claims the benefit of U.S. Provisional Application No. 61/023,418, filed Jan. 24, 2008, which is incorporated herein by reference in its entirety. This application is related to application Ser. No. 12/359,922 filed Jan. 26, 2009, incorporated herein by reference in its entirety.

FIELD OF THE INVENTION

The present invention relates generally to the fabrication of circuits. More particularly, the present invention relates to silicon-based thin film transistors, systems, and methods of forming the same on flexible substrates.

BACKGROUND OF THE INVENTION

Transistors are semiconductor devices, commonly used as an amplifier or an electrically controlled switch. The transistor is the fundamental building block of the circuitry in computers, cellular phones, and all other modern electronic devices. Because of its fast response and accuracy, the transistor is used in a wide variety of digital and analog functions, including amplification, switching, voltage regulation, signal modulation, and oscillators. Transistors may be packaged individually or as part of an integrated circuit.

Thin film transistors (TFT) are a special kind of field effect transistor made by depositing thin films of a semiconductor active layer as well as the dielectric layer and metallic contacts over a supporting substrate. A common substrate is glass, because one of the primary application of TFTs is in liquid crystal displays (LCDs). This differs from the conventional transistor where the semiconductor material typically is the substrate, such as a silicon wafer.

TFTs can be made using a wide variety of semiconductor materials. A common material is silicon. The characteristics of a silicon-based TFT depend on the crystalline state of the silicon. That is, the semiconductor layer can be either amorphous silicon, microcrystalline silicon, or it can be polysilicon or single crystalline silicon. Other materials which have been used as semiconductors in TFTs include compound semiconductors such as cadmium selenium (CdSe) and metal oxides such as zinc oxide. TFTs have also been made using organic materials (referred to as an organic TFT or OTFT).

There has been a growing trend to fabricate TFTs on flexible substrates, such as, for example, plastics and poly films. Such substrates are lower in cost than glass and provide a wider range of applications, such as, for example, flexible displays, packaging, signage, labeling, and other similar applications. However, many difficulties arise in the manufacture of TFTs on flexible substrates, particularly plastics, particularly due to the high temperatures used in manufacturing TFTs.

Because a flexible substrate such as plastic or poly film cannot withstand the high annealing temperature, deposition, patterning, doping and other processes used in TFT fabrication must be completed under relatively low temperatures. Chemical vapor deposition, and/or physical vapor deposition (usually sputtering) are techniques often applied in the fabrication of TFTs. However, desirable performance characteristics, such as high carrier mobilities, low leakage currents and threshold voltages, for high-performance applications such as, for example, for use in liquid crystal displays, are difficult to achieve when low processing temperatures are used. Processing temperatures (<150° C.) below those used for TFT fabrication on glass substrates must be maintained for compatibility with low-cost plastic substrate materials. In general, superior TFT performance is achieved with higher-temperature fabrication processes, because crystalline material can be deposited at the higher temperatures, dopants can be activated at higher temperatures, and the quality of the critical gate-dielectric interface, which is highly sensitive to process temperature, can be controlled.

To attempt to address these and other issues, researchers in the field have tried a number of different approaches. Laser annealing of silicon has been studied for many years as a means for improving the crystalline nature of a deposited film. Typically, an amorphous silicon film is deposited and a short pulse duration excimer laser is used to melt a portion of the silicon film. As the silicon cools between pulses, crystallization may occur resulting in crystal grains of various sizes. This approach has been used with success on both glass and plastic substrates.

Laser-induced doping of silicon is a promising method that has been used to create conductive silicon film for use in thin film transistors. One implementation of laser-induced doping is known as gas immersion laser doping (GILD). In a GILD process, a laser pulse induces the melting of silicon in the presence of a precursor, or dopant, gas. Part of the gas species already chemisorbed or impinging on the melted silicon surfaces diffuses into the molten silicon. As a result of the melting and solidification cycle in the presence of the dopant gas, the dopant is incorporated into the silicon layer. Using this approach and/or similar approaches, researchers have been able to achieve high dopant concentrations (both N-type and P-type) and excellent spatial dopant profiles, all while retaining highly crystalline silicon and low surface roughness. Details of this process can be found in: G. Kerrien et al., App. Surf. Sc. 186 (2002) at 45-51, and A. Slaoui et al., J. Appl. Phys 67 (10) 1990, p. 6197.

Even though advances have been made in creating polycrystalline thin films, doping silicon films at low temperature and fabricating TFTs using these thin films, there remains a need for relatively low-cost systems and simplified methods for fabricating a high-performance Si-based TFT on a flexible, plastic substrate.

SUMMARY OF THE INVENTION

The systems and methods of fabricating a silicon-based thin film transistor of the present disclosure overcome the inherent deficiencies described above. The systems and methods of the present disclosure provide for the fabrication of TFTs on flexible substrates at low processing temperatures in both a self-aligned and non-self-aligned fashion. The TFTs of the present invention exhibit better performance characteristics, such as, for example, high mobility, high switching frequency, low operating voltage, and low threshold voltage when compared to other methods for TFT fabrication on flexible substrates. The improved performance is also achieved at a significantly lower cost compared to existing approaches. Further, the methods of embodiments of the present invention include a combination of deposition and patterning techniques that can reduce the number of processing or fabrication steps, such as etching steps, patterning steps, and the like, from traditional fabrication of TFTs to reduce the cost of TFT fabrication and increase input, while maintaining or enhancing TFT performance.

In embodiments of the invention, a method for making self-aligned silicon thin film transistors includes depositing a barrier material on at least a portion of a flexible substrate, forming a one silicon assembly on at least a portion of the barrier material, depositing a dielectric material to form a gate dielectric on at least a portion of the at least one silicon assembly, depositing a gate electrode material on at least a portion of the dielectric material to form at least one transistor assembly, selectively patterning the gate electrode material and the dielectric material, selectively doping areas of the at least one transistor assembly thereby forming a source and a drain, and removing excess doping material to form a self-aligned silicon thin film transistor. In one embodiment, the barrier material is printed on the substrate, rather than blanket deposited, forming a patterned barrier layer. This patterned barrier layer can increase the flexibility of the transistor, and is less prone to cracking than unpatterned barrier layers. Further, a patterned barrier layer promotes better adhesion to the substrate, especially during flexure of the substrate, to reduce delamination of the transistor from the substrate.

In other embodiments of the invention, the silicon layer is cleaned before the dielectric material is deposited on it. This clean can include a cleaning process such as an HF clean, followed by $UV/O_2$ or $UV/O_2/F_2$ process to form a thin, high quality SiO2 interface between the silicon layer and the gate dielectric. This interface improves electrical performance between the Si and the gate dielectric, and therefore overall transistor performance.

Embodiments of the present invention can include one or more printing steps. In addition to the option of printing the transistor layers, such as the barrier layer, silicon layer, dielectric layer, gate electrode layer, and/or dopant layer(s), masking layers used in one or more etching steps can be printed to achieve tighter tolerances of the components, without compromising transistor performance. One such method of printing layers of the transistor and/or masking layers can include the use of printing plates formed by traditional photolithography methods, as described in U.S. Patent Application Publication No. 2008/0092377 entitled "Patterned Printing Plates And Processes For Printing Electrical Elements," incorporated herein by reference in its entirety.

The above summary of the invention is not intended to describe each illustrated embodiment or every implementation of the present invention. The figures and the detailed description that follow more particularly exemplify these embodiments.

DETAILED DESCRIPTION OF THE DRAWINGS

A silicon-based thin film transistor, according to various embodiments described herein, generally can be fabricated on flexible substrates, such as polymeric or plastic substrates or metal foil substrates such as stainless steel, using either a non-self aligned approach or a self-aligned approach. As defined herein, a self-aligned approach is such that the gate electrode layer can be used as a mask that enables one to align the gate with the source, drain, and channel of the transistor without the need for additional or independent steps. The approach of this invention also improves the flexibility of the end product or TFT circuit by removing excess silicon and silicon dioxide where they are not needed. Both such approaches are depicted and described herein.

Transistor devices or TFTs of the present invention generally comprise source and drain electrodes, a semiconductor channel, dielectric, and gate electrode layers, arranged in any of a combination of ways to create a functional transistor. Patterned layers therefore can comprise conductive, semiconductive, and insulating materials printed or otherwise deposited with suitably formulated conductive, insulative, or semiconductive ink, fluid, powder, particulate, or other deposition compositions. The methods of the present invention illustrate a compilation of steps that can be performed, although not necessarily in the particular order as described, to build the TFTs of the present invention. The final TFT assembly is represented as a subassembly defined as the resulting structure after each particular step, as described below, as the TFT is fabricated. For method 100 of FIG. 1, the subassemblies are represented at 50 in FIG. 2, at 52 in FIG. 3A, at 54 in FIG. 6A, at 56 in FIG. 7A, at 58 in FIG. 8A, and at 60 in FIG. 9A. For method 300 of FIG. 10, the subassemblies are represented at 62 in FIG. 11, at 64 in FIG. 12, at 66 in FIG. 13A, at 68 in FIG. 14, at 70 in FIG. 15, at 72 in FIG. 16, at 74 in FIG. 17, and at 76 in FIG. 18A and 78 in FIG. 19. For method 600 of FIG. 21, the subassemblies are represented at 80 in FIG. 22, at 82 in FIG. 23, at 84 in FIG. 24, at 86 in FIG. 25, at 88 in FIG. 26, at 90 in FIG. 27, at 92 in FIG. 28, at 94 in FIG. 29, at 96 in FIG. 30 and at 98 in FIG. 31. Each subassembly can comprise a single transistor subassembly or a plurality of transistor subassemblies being fabricated on a flexible substrate.

Figure 1:
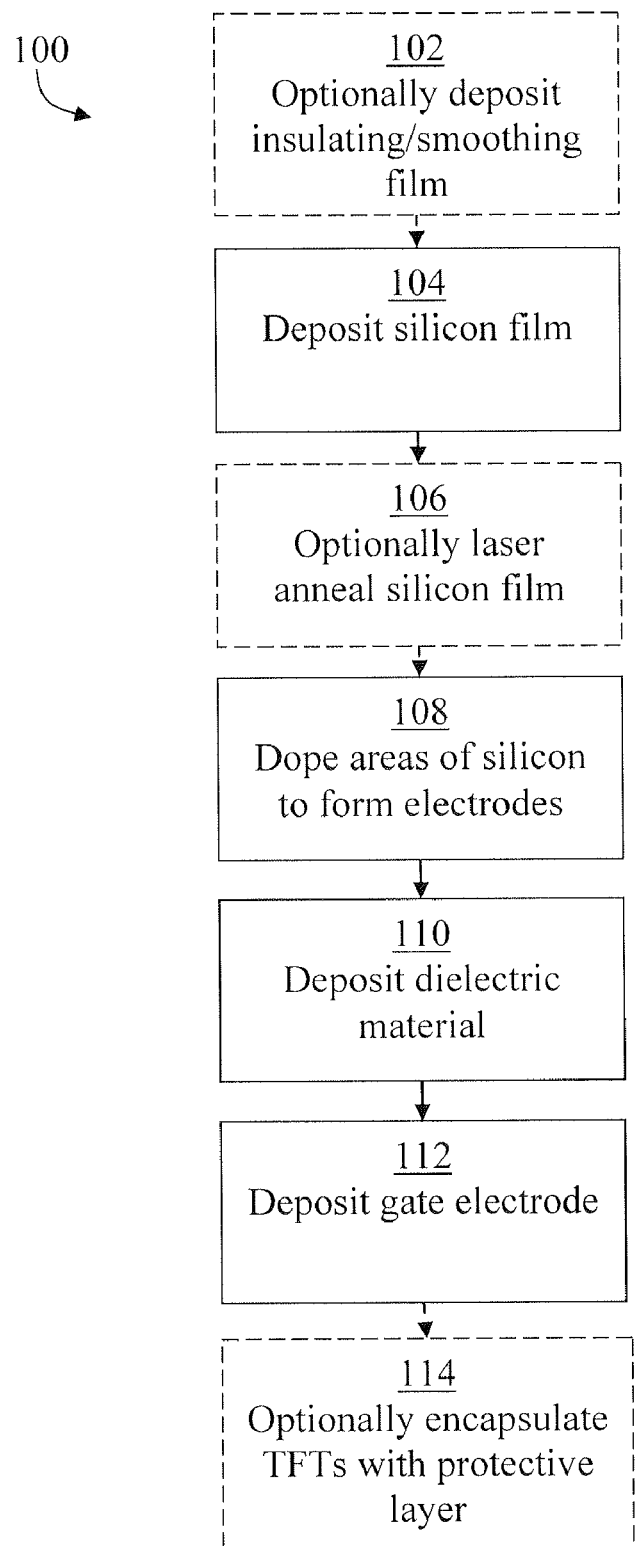
FIG. 1 is a flow chart according to an embodiment of the invention.

Referring to FIG. 1, a method 100 of using a non-self-aligned approach is shown for fabrication of a silicon-based thin film transistor on a flexible substrate, such as a plastic or polymeric substrate or a metal foil substrate. In one embodiment, method 100 can comprise: 1) optionally depositing an insulating/smoothing film or barrier layer such as silicon nitride or silicon oxide or a spin on glass; 2) depositing a silicon film using a suitable deposition process to form isolated islands of silicon on the smoothing film if present, or directly onto the flexible substrate; 3) optionally laser annealing the deposited silicon film to improve the crystalline nature of the film, 4) doping areas of the silicon islands to form source and drain electrodes while leaving areas of the silicon undoped to form the channel of a transistor; 5) depositing a dielectric material such as silicon dioxide, silicon nitride, hafnium oxide or the like using a low temperature process to form the gate dielectric while leaving the contact pads uncovered by the dielectric material; 6) depositing the gate electrode; and 7) and optionally encapsulating the TFTs with a protective layer.

Figure 2:
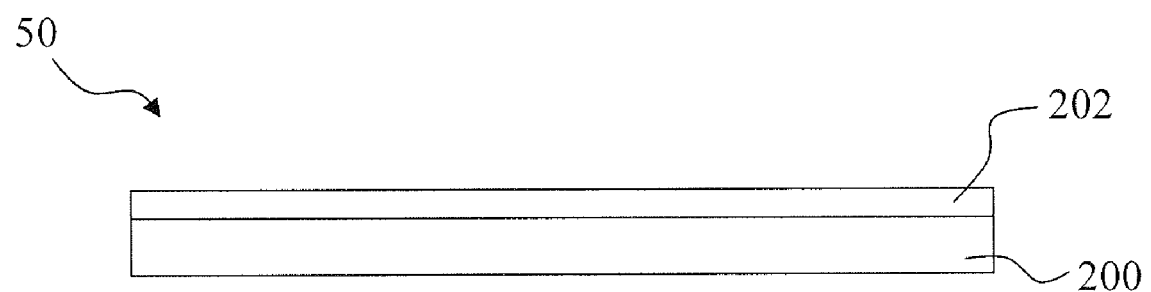
FIG. 2 is a side view of partially fabricated TFTs according to an embodiment of the invention.

At optional step 102 of method 100, a barrier layer 202 is deposited on substrate 200 to form subassembly 50, as depicted in FIG. 2. Substrate 200 can comprise a flexible material such as, for example, a polymeric material, plastic material, paper, nonwoven, woven, stainless steel foil, Al coated plastic film or any other suitable flexible material. In one embodiment, substrate 200 comprises polyethylene terephthalate (PET) film. Substrate 200 can be provided in either web form or sheet form. Substrate 200 can comprise a thickness ranging from about 25 micron to about 400 micron.

Barrier layer 202 functions to insulate the device, or transistor, from the substrate both electrically and thermally. In one embodiment, barrier layer 202 is a dielectric material, such as, for example, silicon nitride, silicon dioxide, a spin-on-glass or combinations thereof. Barrier layer 202 can also act as a barrier material for oxygen, water or other gas phase species by reducing the permeation rate through substrate 200 to protect the fabricated transistor. Further, barrier layer 202 can act as a smoothing film to reduce the roughness of substrate 200 resulting in a smoother interface between substrate 200 and other materials. Additionally, barrier layer 202 can act as a thermal barrier to protect the substrate from damage due to subsequent processing steps such as laser processing.

Barrier layer 202 can be deposited on at least one surface of substrate 200 using any of a variety of suitable deposition processes, such as, for example, traditional printing techniques, chemical vapor deposition (CVD), plasma-enhanced CVD (PECVD), electron beam evaporation, sol gel, liquid phase deposition from a chemical bath and the like, and/or any of a variety of suitable coating processes, such as, for example, die coating (i.e. slot die), curtain coating, spray coating, roll coating, screen coating, and the like and combinations thereof. The use of a mask or masking layer can also be employed to form a patterned barrier layer. In one embodiment of the invention, barrier layer 202 comprises a spin-on material or ink that is deposited by traditional printing techniques, such as, for example, flexography, screen printing, inkjet, and/or gravure to form a patterned barrier layer. Printing plates used in the above printing processes can be formed by one or more methods as described in U.S. Patent Application Publication No. 2008/0092377 entitled "Patterned Printing Plates And Processes For Printing Electrical Elements." Such printing plates can result in higher quality surface morphology, and/or tighter tolerances of the printed design.

In one embodiment of the invention, barrier layer 202 is deposited having a thickness from about 500 nanometers (nm) or less. In some embodiments of the invention, barrier layer 202 is vacuum annealed before further processing.

Step 104 of method 100 can comprise depositing a thin undoped or lightly doped silicon film upon barrier film 202 (if present) or directly on substrate 200. The silicon material can comprise amorphous silicon, polycrystalline silicon, or microcrystalline silicon, preferably of low gas content (e.g. hydrogen, argon). Conventional deposition processes can be utilized. In one embodiment, microcrystalline silicon is deposited using PECVD wherein a silicon-containing gas is introduced into a vacuum chamber. A plasma is struck with the gas in the presence of the substrate 200. This allows silicon atoms to be deposited and result in a high quality, thin coating of silicon, such as, for example, of a thickness of about 200 nm or less. In an alternative embodiment, a physical vapor deposition process such as sputter coating (DC) can be used to deposit amorphous silicon onto substrate 200 or barrier layer 202 (if present). In yet another embodiment, a silicon ink can be printed onto substrate 200 and/or barrier layer 202 with traditional printing techniques, such as, for example, jetting systems such as ink jet, screen printing, gravure, and flexography.

Figure 3A:
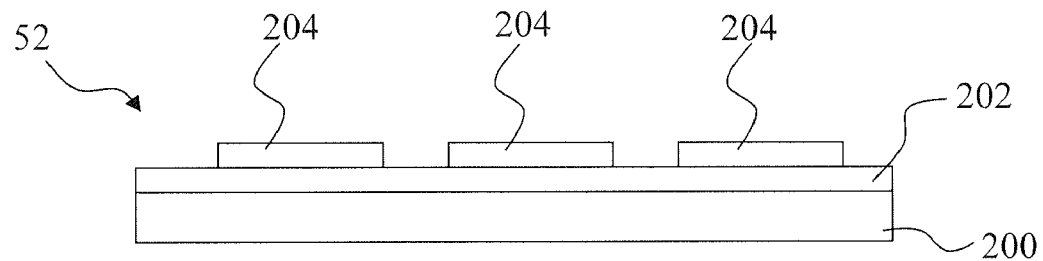
FIG. 3A is a side view of partially fabricated TFTs according to an embodiment of the invention.
Figure 3B:
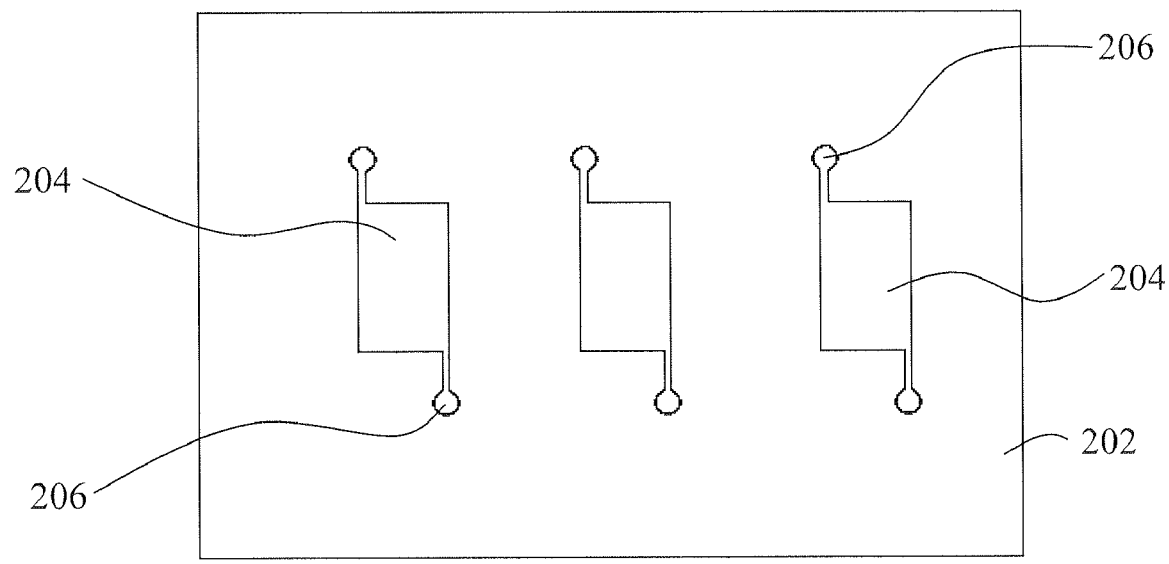
FIG. 3B is a top view of partially fabricated TFTs according to an embodiment of the invention.

Referring to FIGS. 3A and 3B, in one embodiment, isolated patterned silicon deposits 204 can be deposited on barrier layer 202 to form subassembly 52, using a masking process, such as, for example, a shadow mask process. A conventional shadow mask process involves the use of a patterned structure (the shadow mask) wherein the pattern allows materials to pass through the patterned structure in selected areas and blocks the passage of materials through the structure in other areas. The shadow mask is typically brought into close proximity with the substrate or in direct contact with the substrate, the material of interest is deposited, and the shadow mask is removed. This allows the material to be deposited on the substrate only where the material can pass through the shadow mask.

Another masking process includes a lift off process. The lift off process can include printing of a patterned masking layer on barrier film 202 or substrate 200, followed by deposition of silicon on the masking layer. A lift-off process is then used to remove the masking layer, leaving the silicon that is in direct contact with barrier layer 202 and/or substrate 200 to create the patterned deposit 204.

Figure 4:
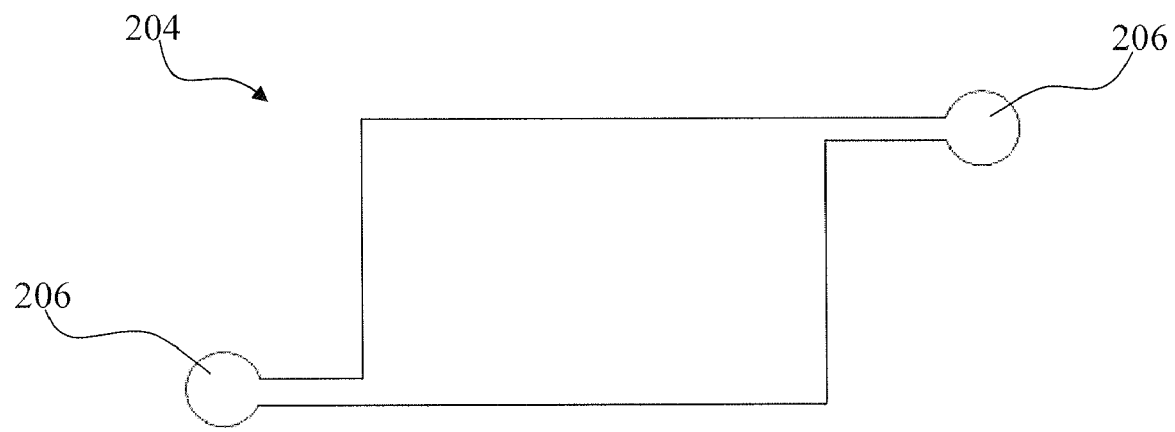
FIG. 4 is a top view of a patterned silicon deposit according to an embodiment of the invention.
Figure 5:
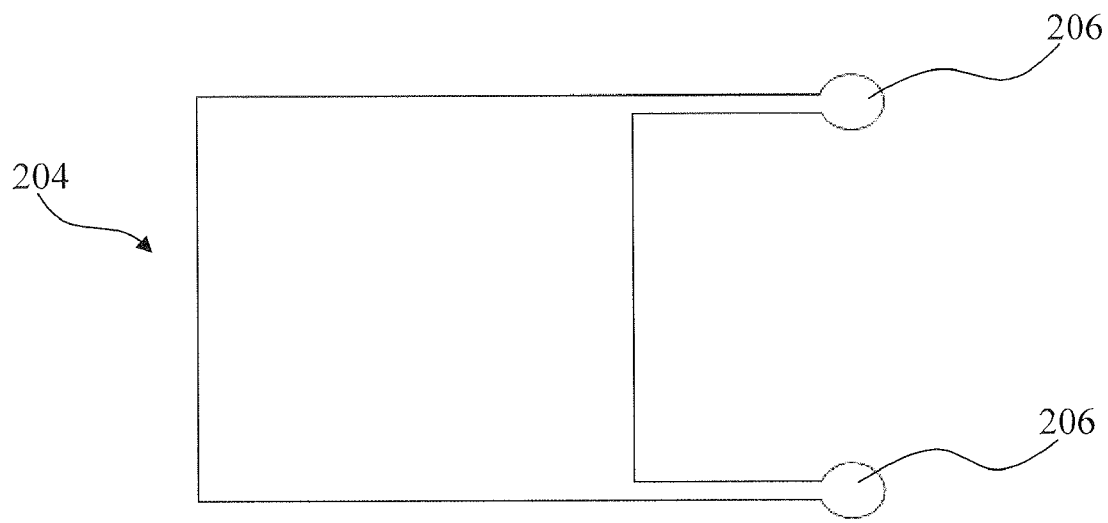
FIG. 5 is a top view of a patterned silicon deposit according to an embodiment of the invention.

Yet another masking approach for forming patterned Si structures on the substrate is to perform a blanket deposition of Si, deposit a masking layer by printing or another suitable deposition technique, and perform a wet or dry etch of the Si. The masking layer would then be removed leaving the patterned Si on the substrate. Another approach is to deposit a blanket layer of Si and use laser ablation to pattern the Si. Deposits 204 can be patterned to include contacts 206. Examples of suitably-shaped deposits with contacts 206 are illustrated in FIGS. 4 and 5. Interdigitated structures can also be created.

In one embodiment of the invention, barrier layer 202 is deposited having a thickness from about 500 nanometers (nm) or less. In some embodiments of the invention, barrier layer 202 is vacuum annealed before further processing.

Step 106 of method 100 comprises an optional annealing process to improve the crystallinity of the silicon, and therefore the performance of the resulting transistor is improved. In one embodiment, a laser annealing process is performed such as described in U.S. Pat. No. 4,409,724 incorporated herein by reference.

Step 108 of method 100 comprises doping of selected areas of silicon deposit 204 by using a laser deposition process, such as, for example, the GILD process as described above to form subassembly 54 illustrated in FIGS. 6A and 6B. In the past, the GILD process was used on silicon wafers that were patterned with a masking layer. However, in the present invention, no such masking layer is needed as the areas of silicon deposit 204 to be doped can be precisely controlled by focus of the laser. A gas, such as $PF_5$ or $BF_3$, is introduced into a vacuum chamber. The laser melts selected areas of the silicon deposit 204 and the dopant gas reacts with the liquid silicon. Further, atomic phosphorous or boron diffuses into the liquid silicon, and becomes physically trapped, occupying substitutional sites and being electrically active.

Figure 6A:
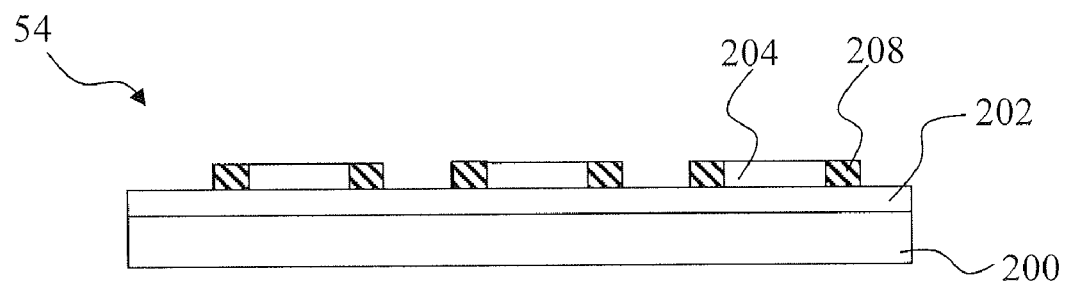
FIG. 6A is a side view of partially fabricated TFTs according to an embodiment of the invention.
Figure 6B:
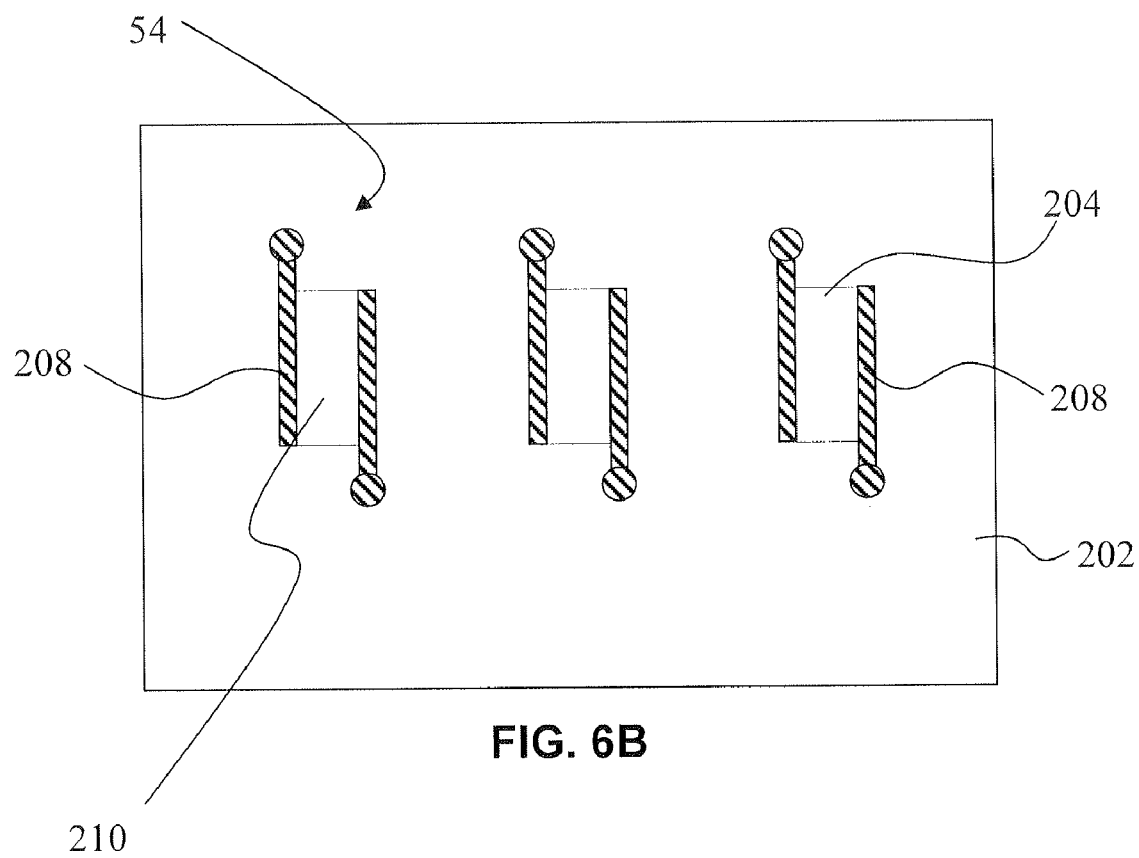
FIG. 6B is a top view of partially fabricated TFTs according to an embodiment of the invention.

As depicted in FIGS. 6A and 6B, the GILD process or other suitable process can be used to dope selected areas of silicon deposit 204 to create doped areas 208 forming the source and the drain of the transistor, while leaving areas of the silicon deposit 204 unchanged with respect to dopant level to form a channel 210 of the transistor. N-type doping to form an NMOS circuit, P-type doping to form a PMOS circuit, or both can be used to form a CMOS circuit. If the channel 210 is lightly doped with one type of dopant, the source and drain should be doped with the opposite type of dopant.

Another approach that can be used to create doped regions of Si is to selectively or non-selectively deposit a "spin on dopant" material by printing or other suitable deposition technique. Spin on dopants are commercially available from, for example, Honeywell, and are used in the photovolatics industry. A laser can then be used to heat and/or melt Si in selective areas and drive the dopant from the spin on dopant into the Si. Alternatively, the spin on dopant can be deposited selectively applying it only to the source and drain regions, avoiding the channel region, and a laser can be used to melt the silicon and drive the dopant into the silicon only in areas where the spin on dopant is present. If desired, both N-type and P-type dopants can be deposited prior to laser processing.

Another approach that can be used to create doped regions of Si is to use a plasma process to deposit a blanket layer of a dopant material followed by laser heating and/or melting of the Si in selected areas to drive the dopant material into the Si. This can be done, for example, by using a plasma and PF5 or BF3 gas.

In all of the processes described for creating doped Si regions, the laser may be incident from either the front side of the substrate where the Si is deposited or the backside of the substrate if the laser light is not absorbed by the substrate or the optional dielectric layer.

An alternative approach to using dopants for creating highly conductive Si regions is to form a silicide by using an appropriate metal such as titanium, cobalt, nickel, platinum, tungsten or the like. Similar deposition and heating approaches can be used as described for the dopant based approach.

Figure 7A:
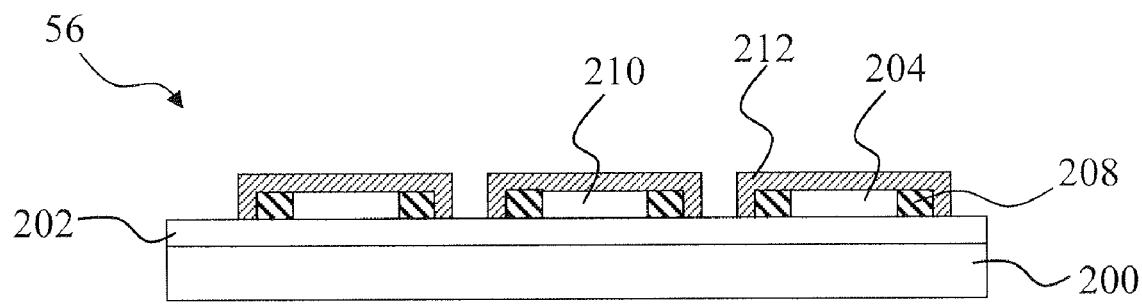
FIG. 7A is a side view of partially fabricated TFTs according to an embodiment of the invention.
Figure 7B:
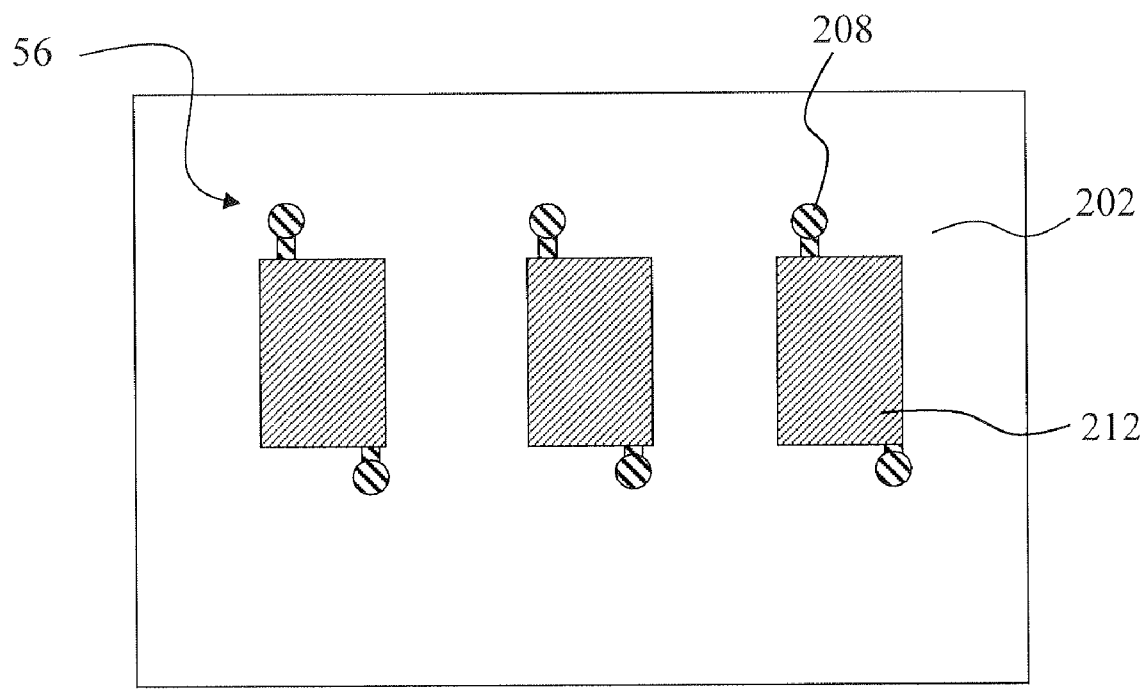
FIG. 7B is a top view of partially fabricated TFTs according to an embodiment of the invention.

Step 110 of method 100 comprises depositing a gate dielectric layer 212. As depicted in FIGS. 7A and 7B, gate dielectric layer 212 covers at least a portion of silicon deposit 204 such that contacts 206 are exposed, forming subassembly 56. Gate dielectric layer 212 can comprise, for example, materials such as silicon dioxide, silicon nitride, hafnium oxide and other suitable dielectric materials for fabricating TFTs and combinations of these materials. Gate dielectric layer 212 can be deposited by low temperature deposition means such as CVD, PECVD, sputtering (DC), liquid phase deposition or similar techniques. If such technique is used, a masking layer, such as a shadow mask described above, can be used to pattern gate dielectric layer 212. A masking or similar technique should prevent the contact pads of the source and drain electrodes from being covered by the dielectric material.

An alternative method of creating the patterned gate dielectric layer is to deposit a blanket layer of the dielectric material, and then deposit a masking layer in selected areas and etch the gate dielectric material in the areas that are not covered by the masking layer. The masking layer can then be removed leaving the patterned gate dielectric material. Another approach is to deposit a blanket layer of the gate dielectric and use laser ablation to pattern the gate dielectric.

In one embodiment of the invention, gate dielectric layer 212 is equal to or less than about 300 nm thick.

In an alternative embodiment, gate dielectric layer 212 can be deposited using a printing or coating technique, such as for example, a jetting system such as inkjet, gravure, and flexography, depending on the material used.

An optional annealing step can be used to improve the quality of the gate dielectric. This annealing may be done in a controlled atmosphere such as a $N_2$, $O_2$, $N_2+F_2$, or combinations of these gases. The annealing step may be carried out by conductive heating, IR based heating, laser irradiation of the gate dielectric causing its temperature to increase, laser irradiation of the underlying materials with conductive heat transfer to the gate dielectric causing its temperature to increase, inductive heating of the underlying materials, combinations of these approaches or other suitable means.

Figure 8A:
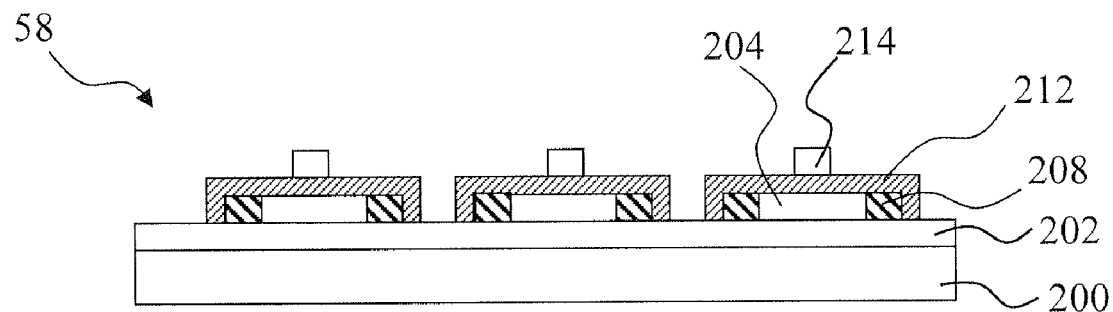
FIG. 8A is a side view of fabricated TFTs according to an embodiment of the invention.
Figure 8B:
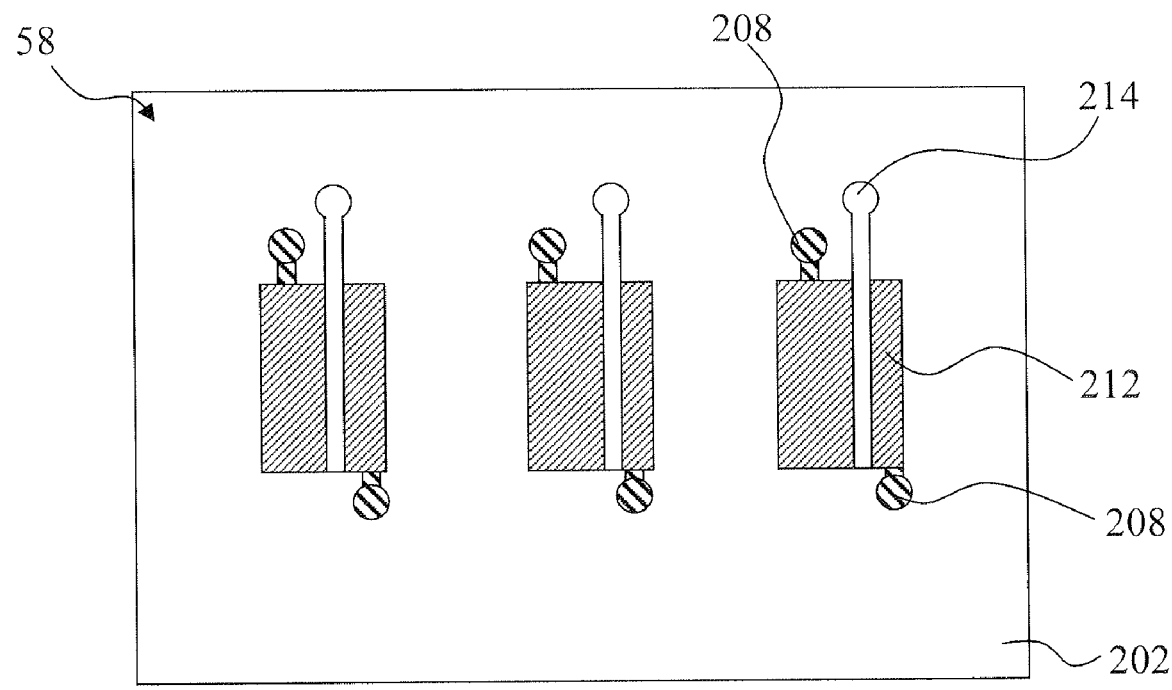
FIG. 8B is a top view of fabricated TFTs according to an embodiment of the invention.
Figure 9A:
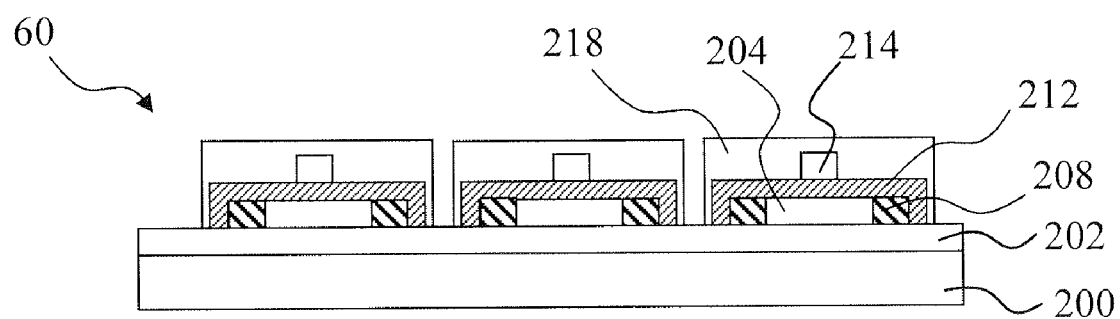
FIG. 9A is a side view of individually encapsulated fabricated TFTs according to an embodiment of the invention.

Step 112 of method 100 comprises depositing gate electrode 214 on gate dielectric layer 212 to form subassembly 58, as depicted in FIGS. 8A and 8B. Gate electrode layer 214 can comprise a highly conductive material, such as, for example, gold, platinum, silver, nickel, titanium, cobalt, chromium, tungsten, aluminum, silicon, doped silicon, conductive polymers, alloys of these materials, and any of a variety of highly conductive materials and combinations thereof. Gate electrode 214 can be deposited using any of a variety of techniques, such as CVD, PECVD, PVD, thermal transfer, printing processes such as, for example, gravure, jetting systems such as ink jet, flexography, lithography, screen printing, and any of a variety of suitable printing techniques and combinations thereof. In one embodiment of the invention, gate electrode 214 is about 1000 nm thick or less. For optimal performance of the resulting transistor, gate electrode 214 should be printed in register with the source and drain electrodes such that gate electrode 214 is positioned between them. This registration functions to minimize overlap and the associated capacitance. An optional laser trimming process may be used to improve the size and shape of the gate electrode if needed by laser ablating unwanted areas of the deposited gate electrode. If a blanket film is deposited, suitable patterning techniques can be used to pattern the gate electrode such as laser ablation or a masking process. Optional interconnects can be deposited during this step as well.

Figure 9B:
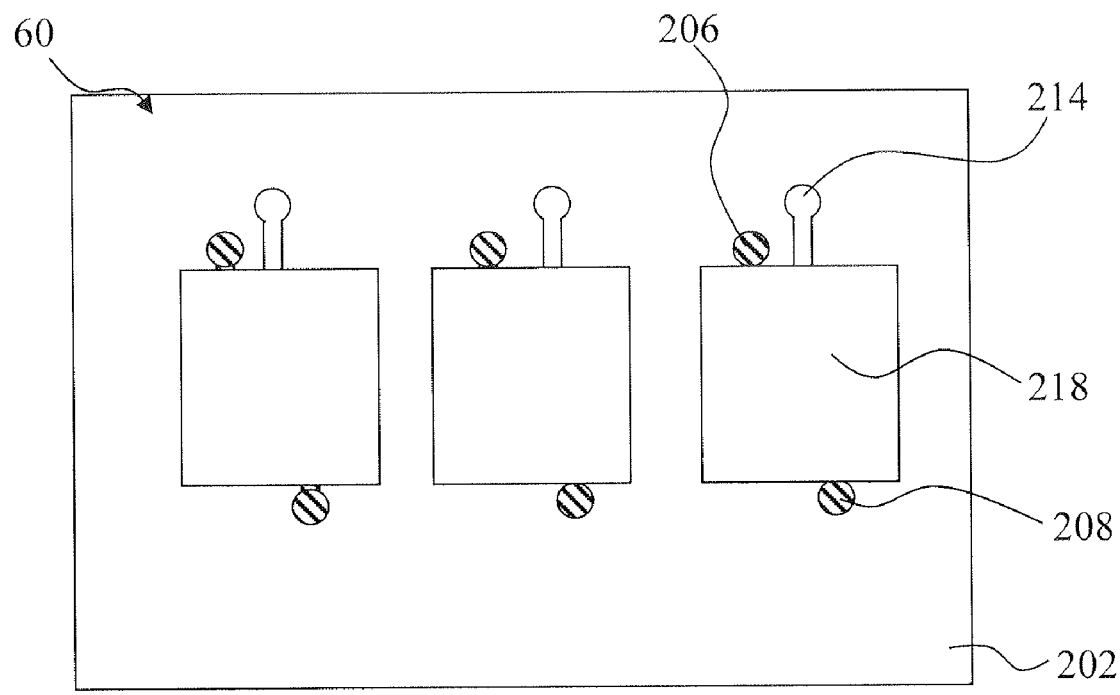
FIG. 9B is a top view of individually encapsulated fabricated TFTs according to an embodiment of the invention.

Step 114 of method 100 comprises depositing an optional encapsulation layer 218. Referring to subassembly 60 of FIGS. 9A and 9B, encapsulation layer 218 functions to protect the resulting transistor 216. Encapsulation layer 218 can be deposited by any of a variety of processes including a coating process such as slot die coating, curtain coating, spray coating and the like, a printing process such as flexography, jetting systems such as inkjet, gravure, screen printing, a deposition process such as CVD, PVD, or PECVD, or a lamination process. Any combination of these processes can be used as well, and the transistor can comprise multiple encapsulation layers 218. In one embodiment, encapsulation layer 218 can comprise a polymer material, such as, for example, polyimide.

An annealing step may be performed after any or all of the deposition steps or after the transistor structure is completely formed in order to improve the transistor performance. This could be a thermal anneal in a controlled environment or in the presence of a plasma such as a hydrogen plasma.

The above described method is intended to be exemplary, and not limiting. Other deposition techniques, such as, for example, sputter coating (DC) or other types of PVD, thermal transfer, spin coating, and the like can be substituted for any of the deposition steps.

Figure 10:
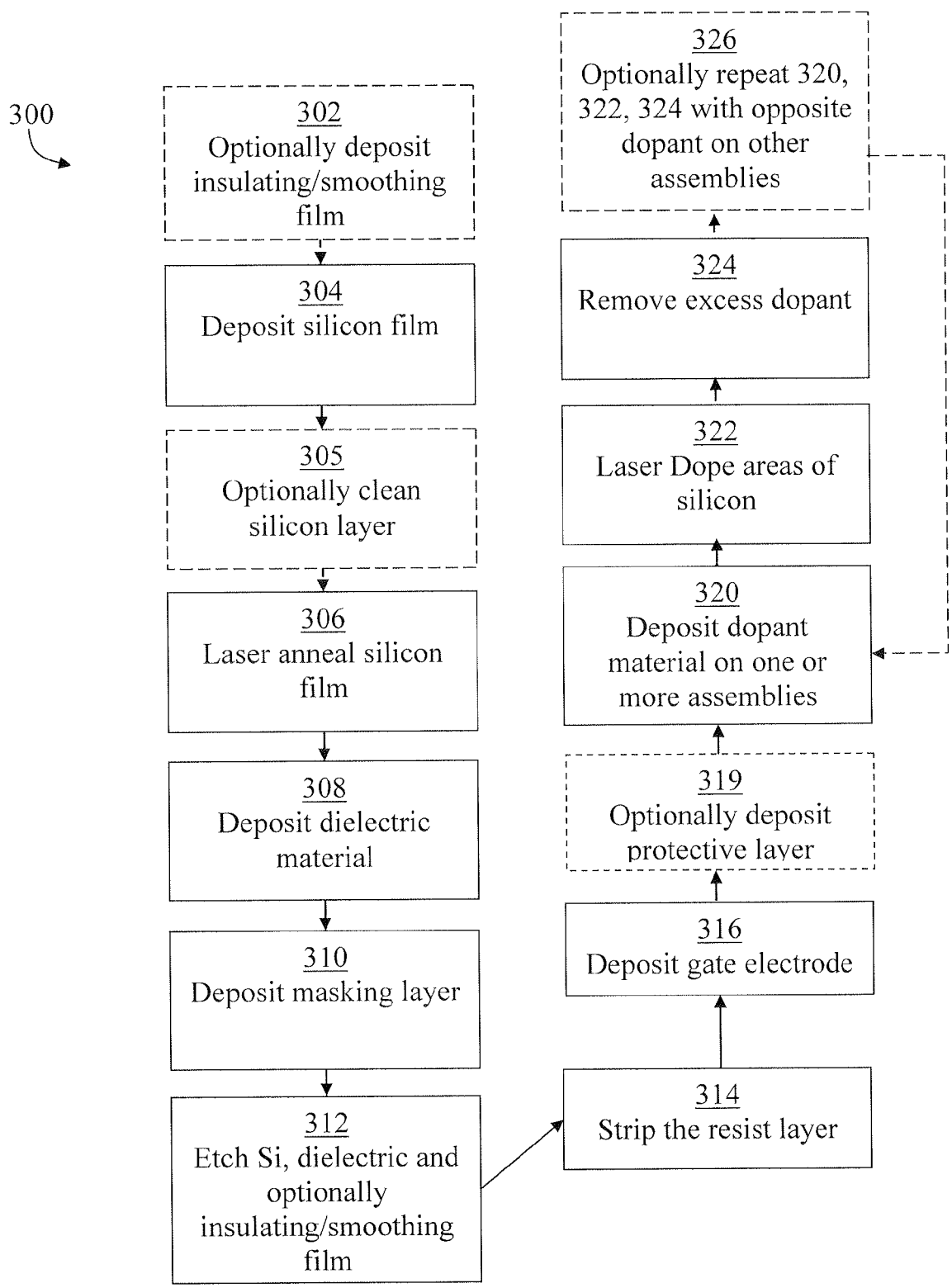
FIG. 10 is a flow chart according to another embodiment of the invention.

There are advantages in the performance of a TFT if the gate is well aligned with the source and drain electrodes, as described in step 112 of method 100 above. An alternative process to method 100 of achieving this is to have a process flow where the gate is self-aligned. Referring to FIG. 10, in an alternative embodiment, a method 300 of using a self-aligned approach is shown for fabrication of a silicon-based thin film transistor on a flexible substrate, such as a plastic or polymeric substrate or metal foil. In one embodiment, method 300 can comprise, in an order contemplated by one of skill in the art: 1) optionally depositing an insulating/smoothing film such as silicon nitride or silicon oxide; 2) depositing a silicon film using a suitable deposition process to form a blanket coating of silicon on the smoothing film if present, or directly onto the flexible substrate; 3) optionally cleaning of the silicon layer; 4) laser annealing of areas of the silicon film that will become the "active" areas of the device to improve the crystalline nature of the film; 5) deposition of a dielectric material such as silicon dioxide at a low temperature process to form the gate dielectric layer over the silicon layer; 6) depositing a masking layer over only the crystallized area of the silicon film and curing of the masking layer if needed; 7) etching the "stack" comprising smoothing film, silicon (crystallized and uncrystallized areas), and gate dielectric to remove areas of the stack everywhere except under the masking layer; 8) stripping the masking layer without attacking the substrate and remaining stack; 9) depositing the gate electrode; 10) depositing a dopant material on the surface of one or more assemblies of a plurality of assemblies; 11) laser doping the source and drain regions of the silicon layer; 12) removing excess dopant; and 13) optionally repeating step 10 with the opposite type of dopant deposited on other assemblies of the plurality of assemblies that is different from the assemblies with the other dopant material, followed by repeating steps 11 and 12 to enable CMOS structures. Alternatively, if the dopants are deposited in selected areas, both N-type and P-type dopants can be deposited in step 10.

Figure 11:
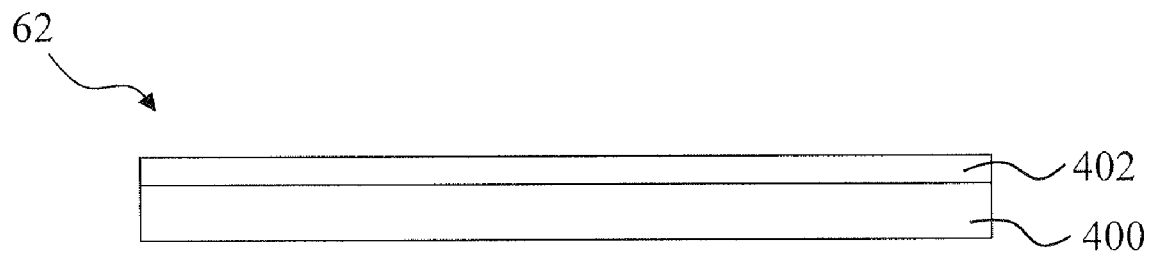
FIG. 11 is a side view of partially fabricated TFTs according to an embodiment of the invention.

At optional step 302 of method 300, a barrier layer 402 is deposited on substrate 400 to form subassembly 62, as depicted in FIG. 11. Similarly to step 102 as described above, substrate 400 can comprise a flexible material such as, for example, a polymeric material, plastic material, paper, nonwoven, woven, stainless steel foil, Al coated plastic, or any other suitable flexible material. In one embodiment of the invention, substrate 400 comprises polyethylene terephthalate (PET) film. Substrate 400 can be provided in either web form or sheet form. Substrate 400 can comprise a thickness ranging from about 25 micron to about 400 micron.

Barrier layer 402 functions to insulate the device, or transistor, from the substrate, both electrically and thermally. In one embodiment, barrier layer 402 is a dielectric material, such as, for example, silicon nitride, silicon dioxide, a spin on glass or combinations thereof. Barrier layer 402 can also act as a barrier material for oxygen, water or other gas phase species by reducing the permeation rate through substrate 400 to protect the fabricated transistor. Further, barrier layer 402 can act as a smoothing film to reduce the roughness of substrate 400 resulting in a smoother interface between substrate 400 and other materials. Barrier layer 402 can also act as a thermal barrier to prevent damage to the substrate from subsequent processing steps such as laser processing.

Barrier layer 402 can be deposited on at least one surface of substrate 400 using any of a variety of suitable deposition processes, such as, for example, traditional printing techniques, chemical vapor deposition (CVD), plasma-enhanced CVD (PECVD), electron beam evaporation, sol gel, liquid phase deposition from a chemical bath and the like, and/or any of a variety of suitable coating processes, such as, for example, die coating (i.e. slot die), curtain coating, spray coating, roll coating, screen coating, and the like and combinations thereof. The use of a mask may also be employed to form a patterned barrier layer.

In one particular embodiment, barrier layer 402 comprises a silicon dioxide sputter film ranging in thickness from about 200 nm to about 1000 nm.

In another embodiment of the invention, barrier layer 402 comprises a patterned spin-on glass material that is deposited by traditional printing techniques, such as, for example, flexography, screen printing, inkjet, and/or gravure. Printing plates used in the above printing processes can be formed by one or more methods as described in U.S. Patent Application Publication No. 2008/0092377 entitled "Patterned Printing Plates And Processes For Printing Electrical Elements." Such printing plates can result in higher quality surface morphology, and/or tighter tolerances of the printed design.

In some embodiments of the invention, barrier layer 202 is vacuum annealed before further processing.

Figure 12:
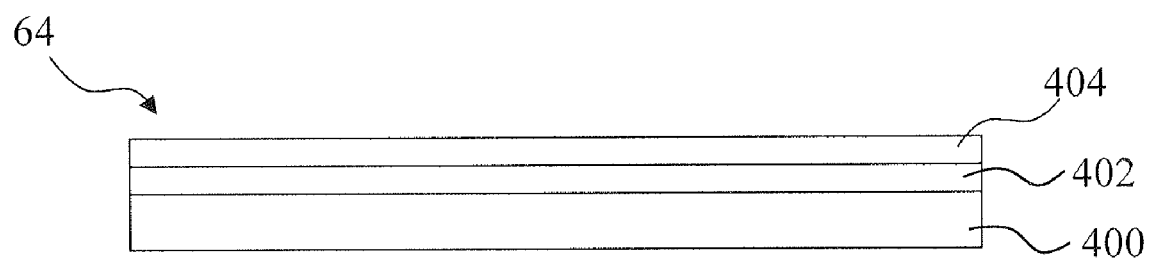
FIG. 12 is a side view of partially fabricated TFTs according to an embodiment of the invention.

In step 304, undoped or lightly doped silicon film 404 is deposited on barrier layer 402 if present, or directly on substrate 400 to form subassembly 64, as illustrated in FIG. 12. Silicon film 404 can comprise amorphous silicon, polycrystalline silicon, or microcrystalline silicon, preferably of low gas content (e.g., hydrogen, argon). Conventional deposition processes can be utilized. In one embodiment, microcrystalline silicon is deposited using PECVD wherein a silicon-containing gas is introduced into a vacuum chamber. A plasma is struck with the gas in the presence of the substrate 400. This allows silicon atoms to be deposited and result in a high quality, thin coating of silicon, such as, for example, of a thickness of about 200 nm or less. In an alternative embodiment, a physical vapor deposition process such as DC sputter coating, pulsed DC sputter coating, or RF sputter coating can be used to deposit amorphous silicon onto substrate 400 or barrier layer 402 (if present).

In a particular embodiment, silicon film 404 has a thickness of about 50 nm with a low content of gas, such as hydrogen and/or argon gas. Silicon film 404 can optionally be cleaned in step 305 either in vacuum or outside of the vacuum system. An HF clean, RCA clean, or similar is a suitable cleaning technique for cleans performed outside of the vacuum system. A vapor HF or plasma based clean is appropriate for cleans performed inside the vacuum system.

Figure 12A:
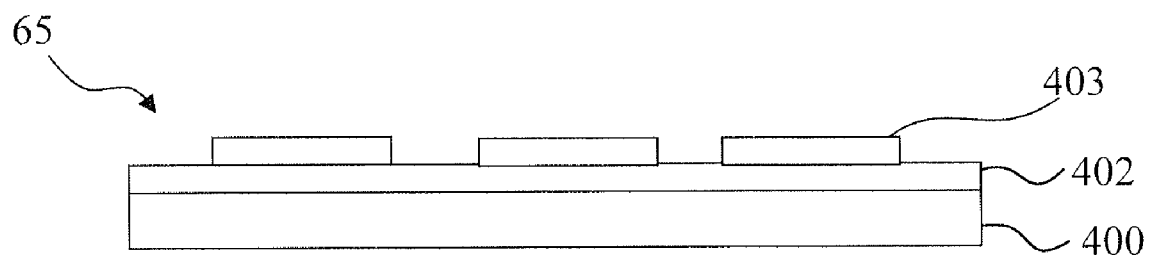
FIG. 12A is a side view of partially fabricated TFTs according to an alternative embodiment of the invention from FIG. 12.

In an alternative embodiment illustrated in FIG. 12A, isolated patterned silicon deposits 403 can be deposited on barrier layer 402 to form subassembly 65 using a masking process, such as, for example, a shadow mask process. A conventional shadow mask process involves the use of a patterned structure (the shadow mask) wherein the pattern allows materials to pass through the patterned structure in selected areas and blocks the passage of materials through the structure in other areas. The shadow mask is typically brought into close proximity with the substrate or in direct contact with the substrate, the material of interest is deposited, and the shadow mask is removed. This allows the material to be deposited on the substrate only where the material can pass through the shadow mask.

Another masking process includes a lift off process. The lift off process can include printing of a patterned masking layer on barrier film 402 or substrate 400, followed by deposition of silicon on the masking layer. A lift-off process is then used to remove the masking layer, leaving the silicon that is in direct contact with barrier layer 402 and/or substrate 400 to create the patterned deposit 403.

Yet another masking approach for forming patterned Si structures on the substrate is to perform a blanket deposition of Si, to form blanket film 404, deposit a masking layer by printing or another suitable deposition technique, and perform a wet or dry etch of the Si. The masking layer would then be removed leaving the patterned Si on the substrate. Another approach is to deposit a blanket layer of Si and use laser ablation to pattern the Si. Deposits 403 can be patterned to include contacts. Interdigitated structures can also be created.

In yet another embodiment, a silicon ink can be printed onto substrate 400 and/or barrier layer 402 with traditional printing techniques, such as, for example, jetting systems, gravure, and flexography to form a patterned silicon deposits 403.

Figure 13A:
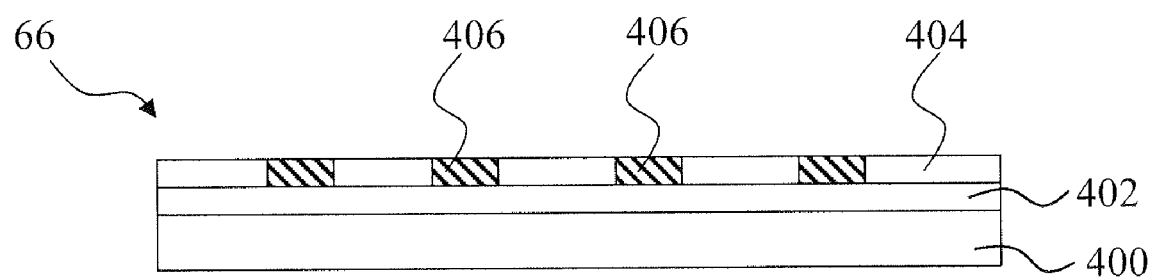
FIG. 13A is a side view of partially fabricated TFTs according to an embodiment of the invention.
Figure 13B:
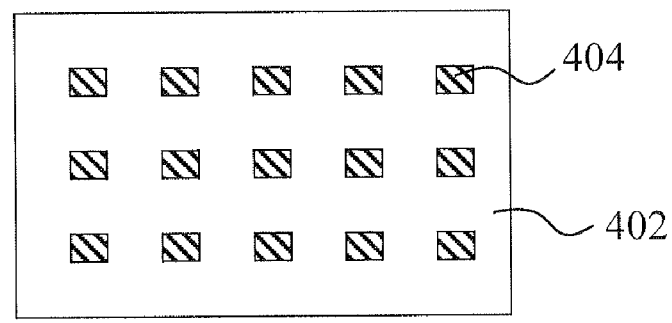
FIG. 13B is a top view of partially fabricated TFTs according to an embodiment of the invention.

In step 306, a laser annealing process, similar to step 106 of method 100, is performed to crystallize only areas 406 of silicon film 404 or silicon deposits 403 that will be active areas of the resulting transistor device to form subassembly 66, as depicted in FIGS. 13A and 13B. Silicon film 404 is annealed to improve the crystallinity of the silicon, and therefore the performance of the resulting transistor is improved.

In one embodiment, a laser annealing process is performed such as described in U.S. Pat. No. 4,409,724, incorporated herein by reference.

Suitable lasers can include, for example, eximer, YAG, and copper vapor lasers. In one embodiment of the invention, fiducial markers can also be created with the laser, or alternatively, printed, embossed, or laminated on silicon film 404 or the substrate.

Figure 14:
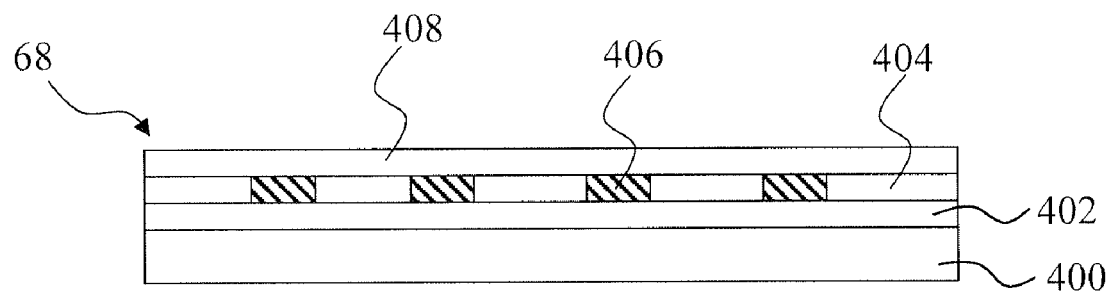
FIG. 14 is a side view of partially fabricated TFTs according to an embodiment of the invention.

In step 308, gate dielectric layer 408 is deposited over both crystallized areas 406 and the remaining silicon film 404, to form subassembly 68 as illustrated in FIG. 14. Gate dielectric layer 408 can comprise, for example, materials such as silicon dioxide, silicon nitride, hafnium oxide and other suitable dielectric materials for fabricating TFTs and combinations of these materials. Gate dielectric layer 408 can be deposited by low temperature deposition means such as CVD, PECVD, sputtering (DC and the like), liquid phase deposition or similar techniques, similar to the processes described in step 110 of method 100, with or without masking layers. In one embodiment of the invention, gate dielectric layer 212 is equal to or less than about 300 nm thick. In a particular embodiment, gate dielectric layer 408 comprises silicon dioxide deposited by PECVD at low temperatures.

Preferably, gate dielectric layer 408 comprises a high quality oxide. In some embodiments of the invention, a cleaning step is performed to silicon layer 404 prior to depositing gate dielectric layer 408. This clean can include a suitable procedure, such as, for example, an HF clean, followed by $UV/O_2$ or $UV/O_2/F_2$ process to form a thin, high quality SiO2 interface between Si and the deposited gate dielectric. This interface improves electrical performance between the Si and the deposited gate dielectric.

An alternative method of creating the patterned gate dielectric layer is to deposit a blanket layer of the dielectric material, and then deposit a masking layer in selected areas and etch the gate dielectric material in the areas that are not covered by the masking layer. The masking layer can then be removed leaving the patterned gate dielectric material. Another approach is to deposit a blanket layer of the gate dielectric and use laser ablation to pattern the gate dielectric.

In an alternative embodiment, gate dielectric layer 408 can be deposited using a printing or coating technique, such as for example, a jetting system such as inkjet, gravure, screen printing, and flexography, depending on the material used.

An optional annealing step may be used to improve the quality of the gate dielectric. This annealing may be done in a controlled atmosphere such as a N2, O2, N2+F2, or combinations of these gases. The annealing step may be carried out by conductive heating, IR based heating, laser irradiation of the gate dielectric causing its temperature to increase, laser irradiation of the underlying materials with conductive heat transfer to the gate dielectric causing its temperature to increase, inductive heating of the underlying materials, combinations of these approaches or other suitable means.

Figure 15:
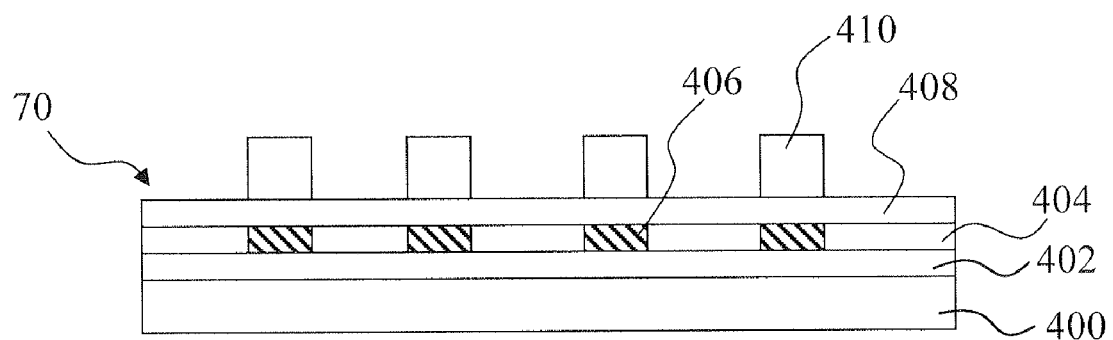
FIG. 15 is a side view of partially fabricated TFTs according to an embodiment of the invention.

In step 310, a masking layer 410, such as an etch mask, resist layer or photomasking layer, is applied only over crystallized areas 406, to form subassembly 70 as shown in FIG. 15. Masking layer 410 may be applied by traditional printing techniques such as screen printing, jetting systems such as inkjet printing, gravure printing, flexography, or the like. Additionally, masking layer 410 may be applied by spray coating through a shadow mask or through the use of traditional photolithography techniques. In various embodiments, masking layer 410 is cured using a curing process such as, for example, UV curing, thermal curing, electron beam curing, and combinations thereof. By applying masking layer 410 only over areas 406, a blanket exposure, such as to UV light, can be used to cure or expose the material of masking layer 410.

Figure 16:
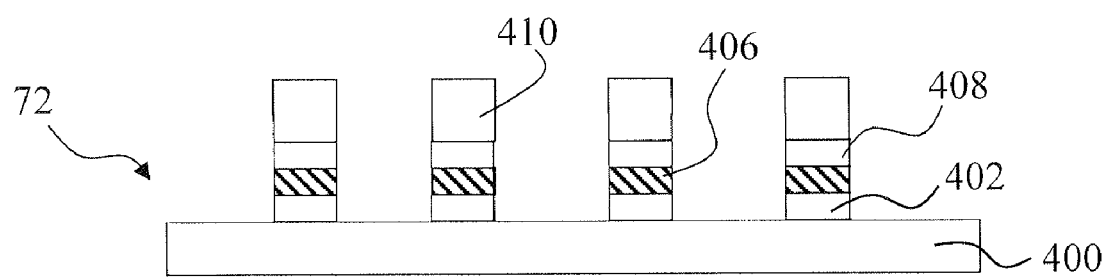
FIG. 16 is a side view of partially fabricated TFTs according to an embodiment of the invention.

In step 312, an etching process is used to remove the stack comprising of gate dielectric layer 408, silicon layer 406, and optional barrier layer 402, everywhere except under masking layer 410, to form subassembly 72 depicted in FIG. 16. Any suitable etching process, such as, for example, wet etching, dry etching, etching pastes, and other suitable etching techniques and combinations thereof may be used. In one embodiment, step 312 comprises using an HF etch to etch dielectric layer 408, followed by using KOH or $NH_4OH$ to etch silicon layer 404, followed by an additional HF etch to etch barrier layer 402.

Figure 17:
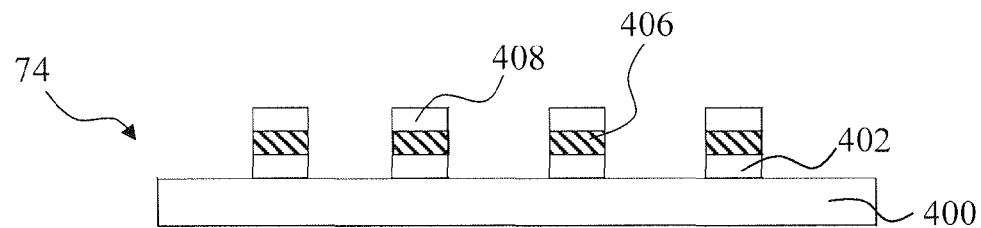
FIG. 17 is a side view of partially fabricated TFTs according to an embodiment of the invention.

Following etching step 312, masking layer 410 is stripped in step 314, to form subassembly 74 as shown in FIG. 17. Depending on the material used for masking layer 410, this could be done using a suitable solvent, or other similar techniques. A suitable process includes one that does not attack exposed substrate 400.

Figure 18A:
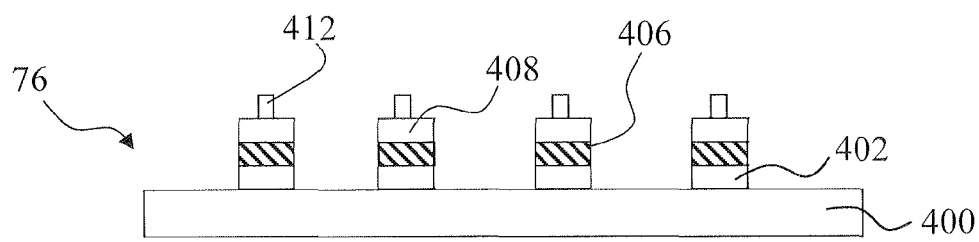
FIG. 18A is a side view of partially fabricated TFTs according to an embodiment of the invention.
Figure 18B:
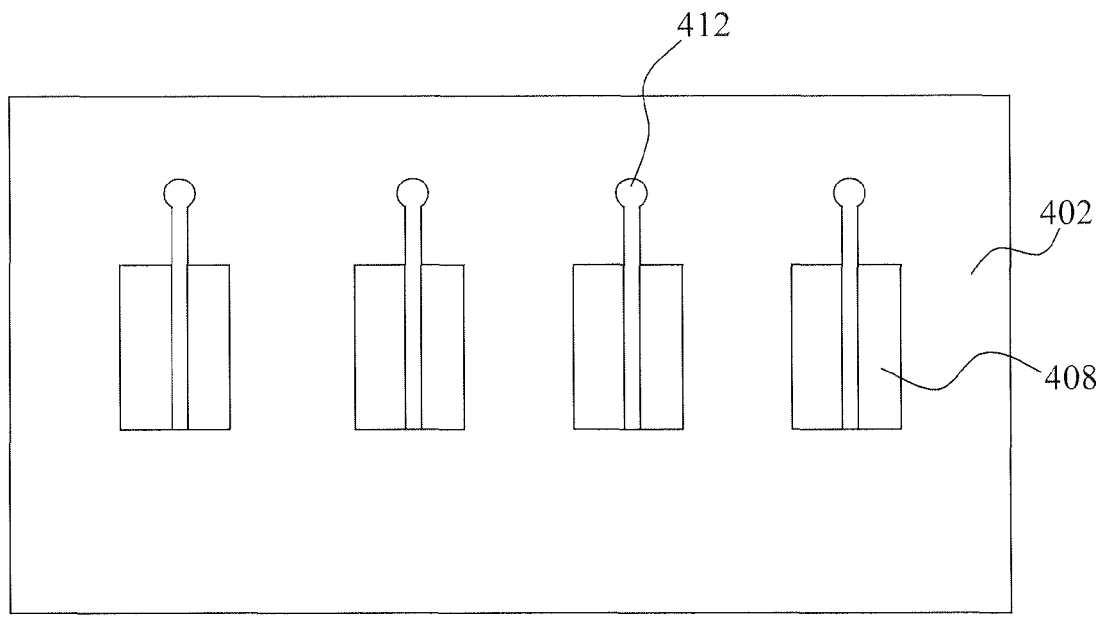
FIG. 18B is a top view of partially fabricated TFTs according to an embodiment of the invention.

Referring to FIGS. 18A and 18B, gate electrode 412 is deposited on the resulting stack in step 316 to form subassembly 76. Gate electrode layer 412 can comprise a highly conductive material, such as, for example, gold, platinum, silver, nickel, titanium, cobalt, chromium, tungsten, aluminum, silicon, doped silicon, conductive polymers, alloys of these materials, and any of a variety of highly conductive materials and combinations thereof. Gate electrode 412 can be deposited using any of a variety of techniques, such as CVD, PECVD, PVD, thermal transfer, printing processes such as, for example, gravure, jetting systems such as ink jet, flexography, lithography, screen printing, and any of a variety of suitable printing techniques and combinations thereof. An optional laser trimming process may be used to improve the size and shape of the gate electrode if needed by laser ablating unwanted areas of the deposited gate electrode.

If a blanket film is deposited, suitable patterning techniques can be used to pattern the gate electrode. In one embodiment, a blanket layer of silicon is deposited. Following this step a masking material is printed and the silicon is etched everywhere except under the masking layer. The masking layer is then removed and the remaining silicon serves as the gate electrode. Optional interconnects can be deposited during this step as well.

An optional protective layer (not depicted) is formed at optional step 319 over gate electrode layer 412 to protect gate electrode layer 412 from any additional processing, such as laser doping and the like processes described in steps 320 through 324 infra. This protective layer protects gate electrode layer 412 from laser ablation, for example, in a laser doping or GILD-type process. For example, if gate electrode comprises a material other than silicon, such as a conductive metal, an optional protective layer can protect the gate electrode from laser ablation when the silicon is undergoing doping processes.

Figure 19:
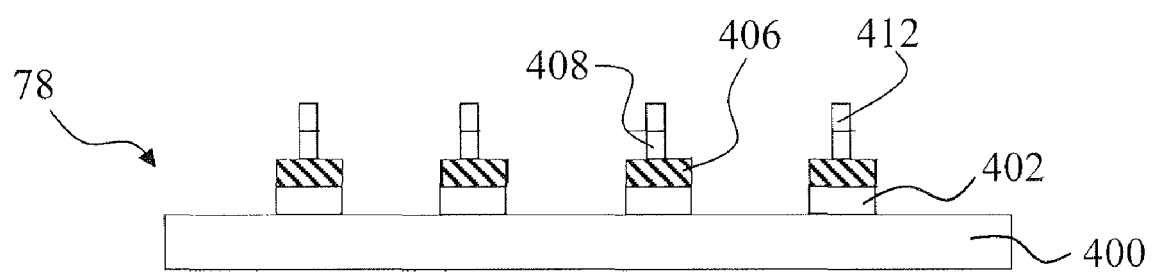
FIG. 19 is a side view of fabricated TFTs according to an embodiment of the invention.

In one alternative embodiment, portions of gate dielectric layer 408 that are not positioned under gate electrode 412 are optionally etched using processes such as wet etch, etching pastes, and any other suitable etch process to form subassembly 78 as depicted in FIG. 19. In one embodiment, exposed gate dielectric layer 408 is etched using an HF etch process. It is this step where gate electrode 412 acts as a mask to self-align gate with the regions that will act as source and drain electrodes of the transistor.

Figure 19A:
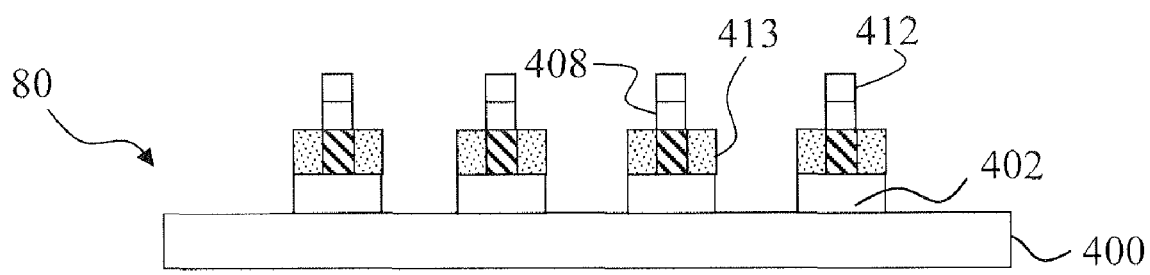
FIG. 19A is a side view of fabricated TFTs with doped source and drain regions according to an embodiment of the invention.

In step 320, a dopant material, such as an N-type dopant or a P-type dopant, is deposited on the exposed surface of subassembly 78. In one embodiment, this step is accomplished by blanket coating one or more layers of boron or phosphorous by PECVD. The resulting transistor 80 is illustrated in FIG. 19A with doped areas 413.

Selected regions 413 of the device are then laser doped in step 322 to form the source and the drain, with an undoped region between them forming a channel. This is accomplished by melting silicon layer 404 using the laser and driving the dopant material into the film. An alternative to the doping technique described above, is the use of a "spin on dopant" which is currently used in the photovoltaic industry. In this embodiment, a spin on dopant may be printed on subassembly 78 and subsequently laser annealed. Additionally, N-type spin on dopants may be printed on a select group of subassemblies 78 and P-type spin on dopants may be printed on a different select group of subassemblies 78. Following the printing of both the N-type and P-type spin on dopants the films are laser annealed. When the gate electrode material is silicon, the gate electrode may be doped at the same time as the source and drain regions. Alternatively the GILD process can be used to selectively dope the Si areas.

As discussed above, the optional protective layer (not depicted) is formed at optional step 319 over gate electrode layer 412 before either step 320 or step 322 to protect gate electrode layer 412 from any additional processing, such as laser doping and the like processes described in steps 320 through 324. This protective layer protects gate electrode layer 412 from laser ablation, for example, in a laser doping or GILD-type process. In an alternative embodiment, subassembly 78 is irradiated from the backside. This allows the barrier, silicon, and dielectric layers to absorb the energy of the laser, thereby acting as a shield for gate electrode layer 412.

Excess dopant is removed in step 324. This can be done by any suitable means, such as, for example, a water rinse, a wet clean using appropriate chemicals, a heat step in vacuum to evaporate the dopant or a clean using gases in a vacuum system. Completion of steps 320 through 324 results in a structure where the gate is automatically aligned with the source and drain electrodes as the gate "shadows" the channel area and dopant material is not in contact with the Si under the gate electrode. In a matrix of TFTs, such as on a web, all or only some of the TFTs can be doped.

In some embodiments, at least one of the TFTs in a matrix is doped with N-type to create NMOS structures, and at least one other of the TFTs is doped with P-type to create PMOS structures. In yet another embodiment, at least one TFT is doped with first either a P-type or N-type dopant, and then steps 320 through 324 are repeated in optional step 326 to dope at least one other TFT with the other of either a P-type dopant or an N-type dopant, resulting in a CMOS structure. An additional cleaning process, such as an HF process, may be needed in between doping sequences.

Further, an optional encapsulation layer can be added, similar to step 114 of method 100 to protect the resulting transistors. The encapsulation layer can be deposited by any of a variety of processes including a coating process such as slot die coating, curtain coating, spray coating and the like, a printing process such as flexography, a deposition process such as CVD, PVD, or PECVD, or a lamination process. Any combination of these processes can be used as well, and the transistor can comprise multiple encapsulation layers. In one embodiment, the encapsulation layer can comprise a polymer material, such as, for example, polyimide.

An annealing step may be performed after any or all of the deposition steps or after the transistor structure is completely formed in order to improve the transistor performance. This could be a thermal anneal in a controlled environment or in the presence of a plasma such as a hydrogen plasma.

The sequence of steps of methods 100 and 300 as described above are for exemplary purposes only and other sequences contemplated by one of ordinary skill in the art are incorporated herein by reference. For example, in method 300, steps 302 through 324 can be completed in the sequence as described. In an alternative embodiment, for example, steps 310, 312, and 314 can be performed after steps 302 and 304, followed by step 308, then steps 316 through 324, with the option of repeating steps 320 through 324, as described above. This approach can possibly minimize the possibility of a short between the gate and channel of the TFT.

Figure 20:
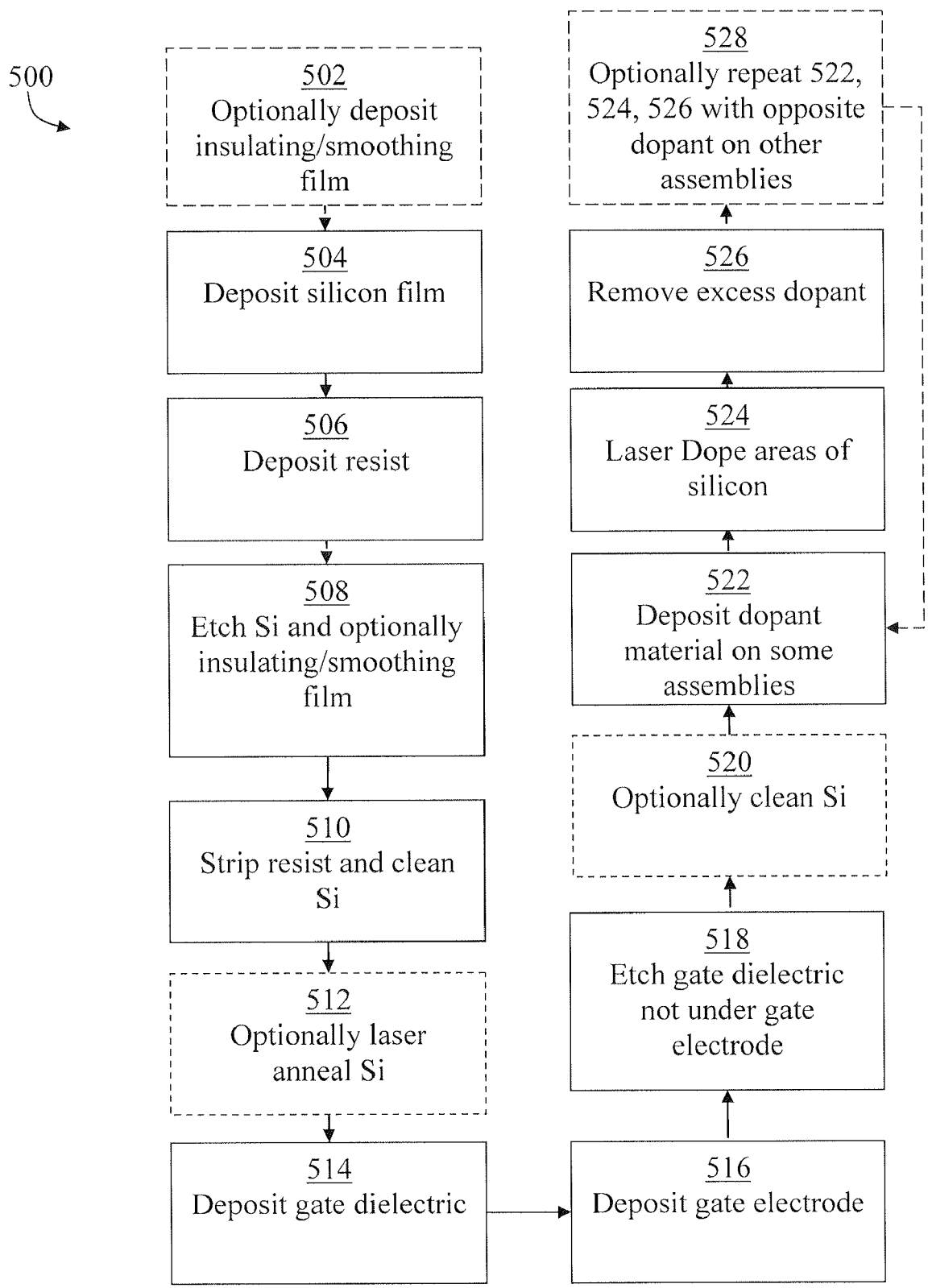
FIG. 20 is a flow chart according to another embodiment of the invention.

In yet another embodiment depicted in FIG. 20, a method 500 comprises: 1) optionally depositing insulating/smoothing film on a flexible substrate; 2) depositing a silicon film on the optional smoothing film; 3) depositing a masking layer on the silicon film layer; 4) etching the silicon and optionally etching the insulting/smoothing film; 5) stripping the masking layer and cleaning the silicon layer; 6) optionally laser annealing the silicon layer at selected areas; 7) depositing a gate dielectric material over the silicon layer; 8) depositing the gate electrode on the gate dielectric layer; 9) etching the gate dielectric layer that is not positioned under the gate electrode; 10) optionally cleaning the silicon layer; 11) depositing a dopant material on the surface of some subassemblies; 12) laser doping areas of the silicon; 13) removing excess dopant; and 14) optionally repeating steps 11 through 13 with an opposite dopant material on other assemblies.

More particularly, in optional step 502 of method 500, a barrier layer is deposited on a flexible substrate, as previously described in steps 102 and 302 above. The substrate can comprise a flexible material such as, for example, a polymeric material, plastic material, paper, nonwoven, woven, stainless steel foil, Al coated plastic or any other suitable flexible material. The substrate can be provided in either web form or sheet form. The substrate can comprise a thickness ranging from about 25 micron to about 400 micron. In one embodiment of the invention, the barrier layer can comprise a dielectric material, such as, for example, silicon nitride, silicon dioxide, spin on glass or combinations thereof.

In step 504, an undoped or lightly doped silicon film is deposited on the barrier layer if present, or directly on the substrate, similar to step 304 described above. The silicon material can comprise amorphous silicon, polycrystalline silicon, or microcrystalline silicon, preferably of low gas content (e.g., hydrogen, argon). Conventional deposition processes can be utilized. In one embodiment of the invention, microcrystalline silicon is deposited using PECVD wherein a silicon-containing gas is introduced into a vacuum chamber. In an alternative embodiment of the invention, a physical vapor deposition process such as DC sputter coating, pulsed DC sputter coating, or RF sputter coating can be used to deposit amorphous silicon onto the substrate or barrier layer if present. In yet another embodiment, a silicon ink can be printed onto the substrate and/or barrier layer with traditional printing techniques, such as, for example, jetting systems, gravure, screen printing, and flexography.

In an embodiment, the silicon film has a thickness of about 50 nm with a low content of gas, such as hydrogen and/or argon gas. The silicon film can optionally be cleaned either in vacuum or outside of the vacuum system. An HF clean, RCA clean, or similar is a suitable cleaning technique for cleans performed outside of the vacuum system. A vapor HF or plasma based clean is appropriate for cleans performed inside the vacuum system.

In step 506, a masking layer can be applied similar to the material and techniques described in step 310. In embodiments of the invention, the masking layer is cured using a curing process such as, for example, UV curing, thermal curing, electron beam curing, and combinations thereof.

In step 508, the silicon layer and optionally the barrier film (if present) is etched everywhere except those areas covered by the patterned masking layer using processes and materials as described above in step 312. Any suitable etching process, such as, for example, wet etching, dry etching, etching pastes, and other suitable etching techniques and combinations thereof may be used. In one example embodiment, a KOH or NH$_4$OH wet etch is used to etch the silicon layer, and an optional HF etch process is used to etch the barrier layer. In step 510, the masking layer is then stripped using techniques as described in step 314, and the silicon layer is optionally cleaned.

In optional step 512, the silicon layer is annealed, such as by a laser annealing process as described in step 306. The silicon film is annealed to improve the crystallinity of the silicon, and therefore the performance of the resulting transistor is improved. In one embodiment, a laser annealing process is performed such as described in U.S. Pat. No. 4,409,724, incorporated herein by reference. Suitable lasers can include, for example, eximer, YAG, and copper vapor lasers. In one embodiment of the invention, fiducial marks can also be created with the laser, or alternatively, printed, embossed, or laminated on the silicon film or the substrate.

In step 514, the gate dielectric layer is deposited on the silicon layer using techniques as described in step 308. The gate dielectric layer can comprise, for example, materials such as silicon dioxide, silicon nitride, hafnium oxide and other suitable dielectric materials for fabricating TFTs and combinations of these materials. The gate dielectric layer can be deposited by low temperature deposition means such as CVD, PECVD, sputtering, liquid phase deposition or similar techniques, similar to the processes described in steps 110 and 308, with or without masking layers. In an alternative embodiment, gate dielectric layer 408 can be deposited using a printing or coating technique, depending on the material used. In some embodiments of the invention, a cleaning step is performed to silicon layer prior to depositing gate dielectric layer. This clean can include a suitable procedure, such as, for example, an HF clean, followed by UV/O$_2$ or UV/O$_2$/F$_2$ process to form a thin, high quality SiO2 interface between Si and the deposited gate dielectric. An optional annealing step may be used to improve the quality of the gate dielectric. This annealing may be done in a controlled atmosphere such as a N2, O2, N2+F2, or combinations of these gases. The annealing step may be carried out by conductive heating, IR based heating, laser irradiation of the gate dielectric causing its temperature to increase, laser irradiation of the underlying materials with conductive heat transfer to the gate dielectric causing its temperature to increase, inductive heating of the underlying materials, combinations of these approaches or other suitable means.

In step 516, the gate electrode is deposited on the gate dielectric layer, using techniques and materials as described in step 316 above. The gate electrode layer can comprise a highly conductive material, such as, for example, gold, platinum, silver, nickel, titanium, cobalt, chromium, tungsten, aluminum, silicon, doped silicon, conductive polymers, alloys of these materials, and any of a variety of highly conductive materials and combinations thereof. The gate electrode can be deposited using any of a variety of techniques, such as CVD, PECVD, PVD, thermal transfer, printing processes such as, for example, gravure, jetting systems such as ink jet, flexography, lithography, screen printing, and any of a variety of suitable printing techniques and combinations thereof. An optional laser trimming process may be used to improve the size and shape of the gate electrode if needed by laser ablating unwanted areas of the deposited gate electrode. If a blanket film is deposited, suitable patterning techniques can be used to pattern the gate electrode. In one embodiment, a blanket layer of silicon is deposited. Following this step a masking material is printed and the silicon is etched everywhere except under the masking layer. The masking layer is then removed and the remaining silicon serves as the gate electrode. Optional interconnects can be deposited during this step as well.

In step 518, the gate dielectric layer is etched everywhere except in areas under the gate electrode, similar to etching step 312 described above. Portions of the gate dielectric layer that are not positioned under gate electrode are etched using processes such as wet etch, etching pastes, and any other suitable etch process. In one embodiment, exposed gate dielectric layer is etched using an HF etch process. It is this step where the gate electrode acts as a mask to self-align gate with the regions that will act as source and drain electrodes of the transistor.

Step 520 comprises an optional cleaning step as described supra.

In step 522, a dopant material, such as an N-type dopant or a P-type dopant, is deposited on the exposed surface of the subassembly. In one embodiment, this step is accomplished by blanket coating one or more layers of boron or phosphorous by PECVD.

The source and drain regions of the device are then laser doped in step 524. This is accomplished by melting the silicon layer using the laser and driving the dopant material into the film. An alternative to the doping technique described above, is the use of a "spin on dopant" which is currently used in the photovoltaic industry. In this embodiment, a spin on dopant may be printed and subsequently laser annealed. Additionally, N-type spin on dopants may be printed on a select group of transistor subassemblies and P-type spin on dopants may be printed on a different select group of transistor subassemblies. Following the printing of both the N-type and P-type spin on dopants the films are laser annealed. When the gate electrode material is silicon, the gate electrode may be doped at the same time as the source and drain regions. Alternatively the GILD process can be used to selectively dope the Si areas.

An optional protective layer (not depicted) is formed over the gate electrode layer before either step 522 or step 524 to protect the gate electrode layer from any additional processing, such as laser doping and the like processes described in steps 522 through 524. This protective layer protects the gate electrode layer from laser ablation, for example, in a laser doping or GILD-type process. In an alternative embodiment, the subassembly is irradiated from the backside in the laser doping step 524. This allows the barrier, silicon, and dielectric layers to absorb the energy of the laser, thereby acting as a shield for the gate electrode layer.

Excess dopant is removed in step 526. This can be done by any suitable means, such as, for example, a water rinse, a wet clean using appropriate chemicals, a heat step in vacuum to evaporate the dopant or a clean using gases in a vacuum system. Completion of steps 522 through 526 results in a structure where the gate is automatically aligned with the source and drain electrodes as the gate "shadows" the channel area. In a matrix of TFTs, such as on a web, all or only some of the TFTs can be doped.

In some embodiments, at least one of the TFTs in a matrix is doped with N-type to create NMOS structures, and at least one other of the TFTs is doped with P-type to create PMOS structures. In yet another embodiment, at least one TFT is doped with first either a P-type or N-type dopant, and then steps 522 through 526 are repeated in optional step 528 to dope at least one other TFT with the other of either a P-type dopant or an N-type dopant, resulting in a CMOS structure. An additional cleaning process, such as an HF process, may be needed in between doping sequences.

Further, an optional encapsulation layer can be added, similar to step 114 of method 100 to protect the resulting transistors. The encapsulation layer can be deposited by any of a variety of processes including a coating process such as slot die coating, curtain coating, spray coating and the like, a printing process such as flexography, a deposition process such as CVD, PVD, or PECVD, or a lamination process. Any combination of these processes can be used as well, and the transistor can comprise multiple encapsulation layers. In one embodiment, the encapsulation layer can comprise a polymer material, such as, for example, polyimide.

An annealing step may be performed after any or all of the deposition steps or after the transistor structure is completely formed in order to improve the transistor performance. This could be a thermal anneal in a controlled environment or in the presence of a plasma such as a hydrogen plasma.

Figure 21:
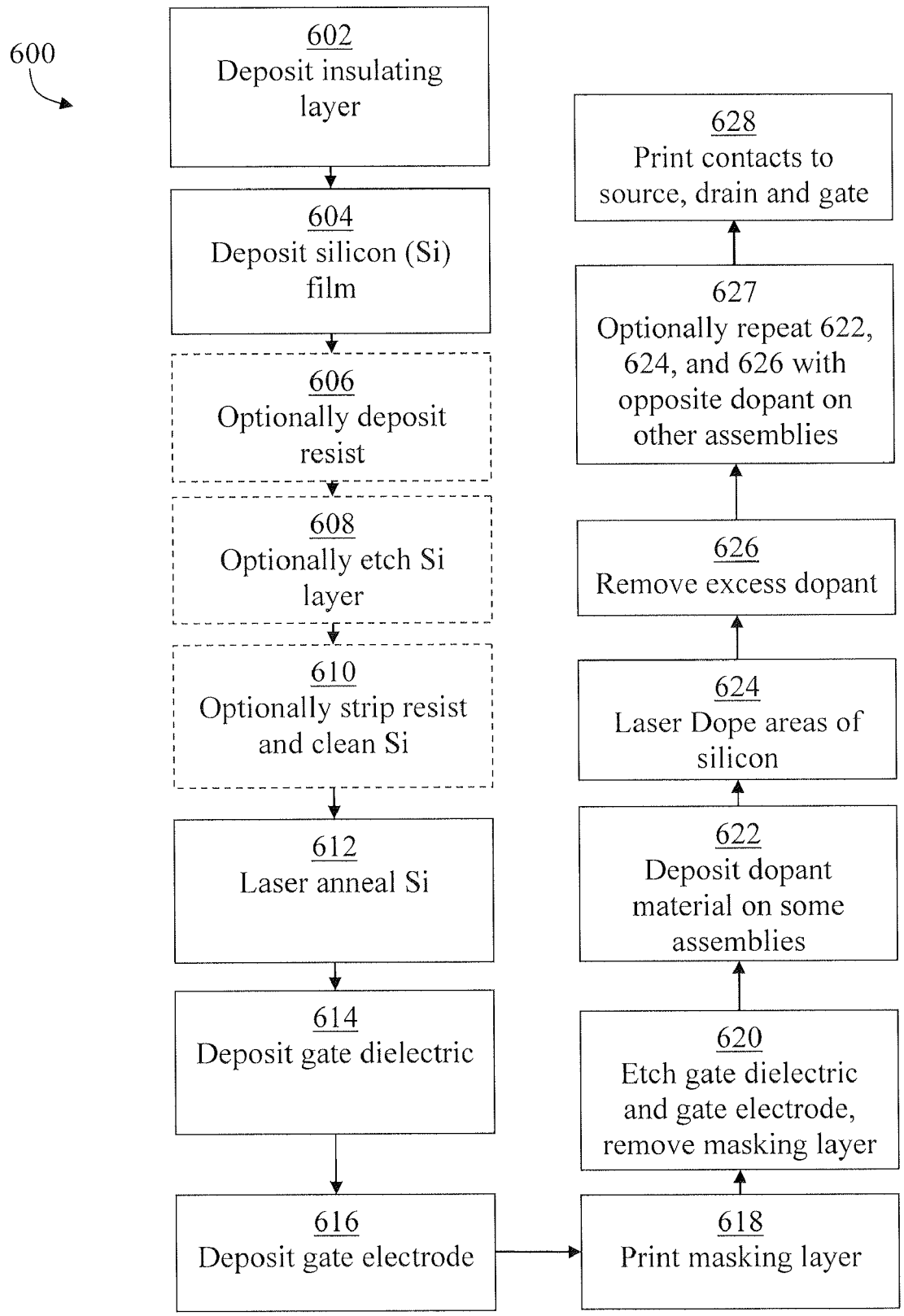
FIG. 21 is a flow chart according to yet another embodiment of the invention.

Referring to FIG. 21, in another embodiment, a method 600 utilizing a self-aligning approach for the fabrication of a silicon-based thin film transistor on a flexible substrate, such as a plastic or polymeric substrate utilizing a patterned insulating film is illustrated. In one embodiment of the invention, method 600 comprises: 1) depositing an insulating film or barrier material, such as a patterned film, on a flexible substrate; 2) depositing a silicon film; 3) optionally depositing a masking layer on the silicon film layer; 4) optionally etching the silicon and optionally etching the insulting film; 5) optionally stripping the masking layer and cleaning the silicon layer; 6) laser annealing the silicon layer and optionally cleaning the silicon layer; 7) depositing a gate dielectric material over the silicon layer; 8) depositing the gate electrode on the gate dielectric layer; 9) printing a masking layer; 10) etching the gate electrode layer and gate dielectric layer and removing the masking layer; 11) depositing a dopant material on the surface of the subassembly; 12) laser doping areas of the silicon; 13) removing excess dopant; and 14) printing contacts to source, drain and gate.

Figure 22:
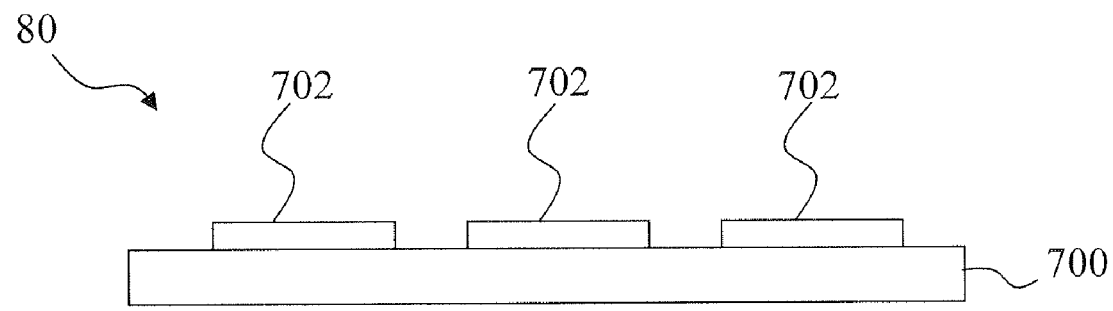
FIG. 22 is a side view of partially fabricated TFTs according to an embodiment of the invention.

More particularly, in step 602 of method 600 of FIG. 21, a barrier layer 702 is deposited on a flexible substrate 700 to form subassembly 80, as depicted in FIG. 22. Substrate 700 can comprise a flexible material such as, for example, a polymeric material, plastic material, paper, nonwoven, woven, stainless steel foil, Al coated plastic or any other suitable flexible material. Substrate 700 can be provided in either web form or sheet form. Substrate 700 can comprise a thickness ranging from about 25 micron to about 400 micron.

In various embodiments, patterned barrier layer 702 is printed to form a non-contiguous pattered layer. Patterned barrier layer 702 can be deposited by traditional printing techniques such as, for example, gravure, screen printing, jetting systems such as ink jet and/or flexography processes. In alternative embodiments, patterned barrier layer 702 is deposited utilizing sputter deposition. In another embodiment, barrier layer 702 is deposited by spray coating through a shadow mask. In one embodiment, patterned barrier layer 702 can comprise a dielectric material, such as, for example, silicon nitride, silicon dioxide, spin on glass, or combinations thereof. In alternative embodiments, patterned barrier layer 702 is comprised of a spin on glass deposited utilizing printing techniques discussed above instead of the traditional spin on processes.

Patterned barrier layer 702 can comprise a thickness of about 0 to about 2000 nm, more specifically about 250 to about 1000 nm, and more specifically about 300 to about 1000 nm. Thus, in various embodiments, patterned barrier layer 702 applied in step 602 of method 600 of FIG. 21 allows for better adhesion of the barrier layer to the substrate especially during flexure of the substrate, effectively reducing delamination. Further, patterned barrier layer 702 allows for increased flexibility and is less prone to the cracking exhibited when utilizing alternative methods.

Printing plates used in the above printing processes to form patterned barrier layer 702 can be formed by one or more methods as described in U.S. Patent Application Publication No. 2008/0092377 entitled "Patterned Printing Plates And Processes For Printing Electrical Elements." Such printing plates can result in higher quality surface morphology, and/or tighter tolerances of the printed design.

In some embodiments of the invention, barrier layer 202 is vacuum annealed before further processing.

However, it should be realized that in an alternative embodiment of the invention, an unpatterned, or blanket barrier layer can deposited as described in step 102 of method 100, step 302 of method 300, and step 502 of method 500. For exemplary purposes only, barrier layer 702 is referred to as a patterned barrier layer.

Figure 23:
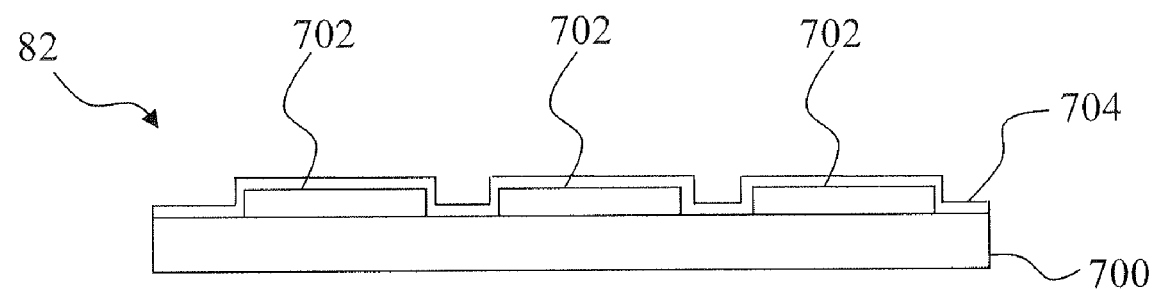
FIG. 23 is a side view of partially fabricated TFTs according to an embodiment of the invention.

In step 604 of FIG. 21, an undoped or lightly doped silicon film 704 is deposited on patterned barrier layer 702 to form subassembly 82 as depicted in FIG. 23. Silicon film 704 may be undoped, lightly P-doped, or lightly N-doped. Silicon film 704 can comprise amorphous silicon, polycrystalline silicon, or microcrystalline silicon, preferably of low gas content (e.g., hydrogen, argon). Conventional deposition processes can be utilized. In one embodiment, a physical vapor deposition process such as DC sputter coating, pulse DC sputter coating, or RF sputter coating can be used to deposit amorphous silicon onto patterned barrier layer 702. In another embodiment, microcrystalline silicon is deposited using PECVD wherein a silicon-containing gas is introduced into a vacuum chamber. In a particular embodiment, silicon film 704 has a thickness of about 50 to about 100 nm with a low content of gas, such as hydrogen and/or argon gas.

In yet another embodiment, a silicon ink can be printed onto substrate 700 and/or barrier layer 702 with traditional printing techniques, such as, for example, jetting systems, gravure, screen printing, and flexography to form isolated silicon deposits.

Figure 24:
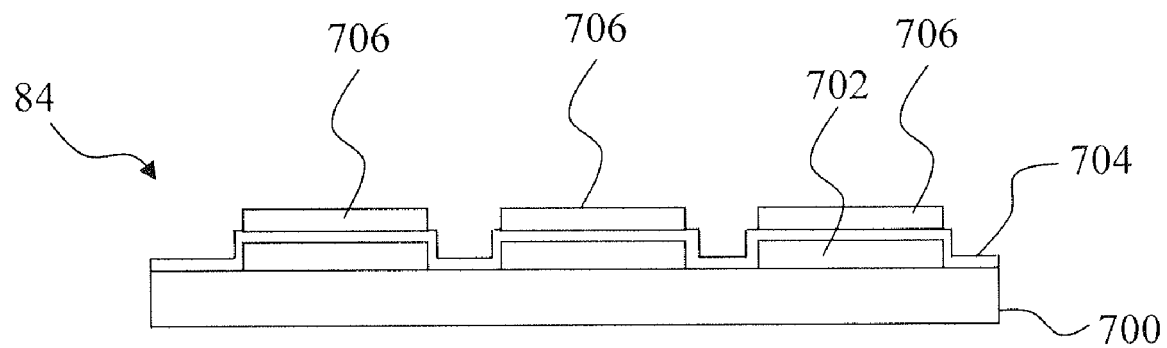
FIG. 24 is a side view of partially fabricated TFTs according to an embodiment of the invention.

In step 606 of FIG. 21, a patterned masking layer 706 can be applied to selective areas using materials and techniques similar to those described in step 310, to form subassembly 84 of FIG. 24. In embodiments of the invention, masking layer 706 is cured using a curing process such as, for example, UV curing, thermal curing, electron beam curing, and combinations thereof. In some embodiments, patterned masking layer 706 is printed on silicon film 704. Known printing techniques such as for example, gravure, jetting systems such as ink jet, flexography, lithography, screen printing, and any of a variety of suitable printing techniques and combinations thereof. In various embodiments patterned masking layer 706 is about 5 µm thick; in a particular embodiment patterned masking layer 706 is about 0.3 µm thick. Further, in various embodiments the patterned masking layer defines the active areas of the device. For example, in one embodiment masking layer 706 is printed to an area of about 200 µm by about 500 µm. In this way, the printing of patterned masking layer 706 allows for more precision in defining the required features of the process and allows for tighter tolerances in the described method 600 of FIG. 21.

In step 608 in FIG. 21, silicon layer 704 is etched everywhere except those areas covered by patterned masking layer 706. Any suitable etching process, such as, for example, wet etching, dry etching, etching pastes, and other suitable etching techniques and combinations thereof may be used. In one embodiment of the invention, step 608 comprises using a KOH or $NH_4OH$ to etch silicon layer 604. Thus, in various embodiments, the advantages of patterned barrier deposition as described in step 602 is realized as patterned barrier layer 702 does not require a separate etching step from current etch step 608.

Figure 25:
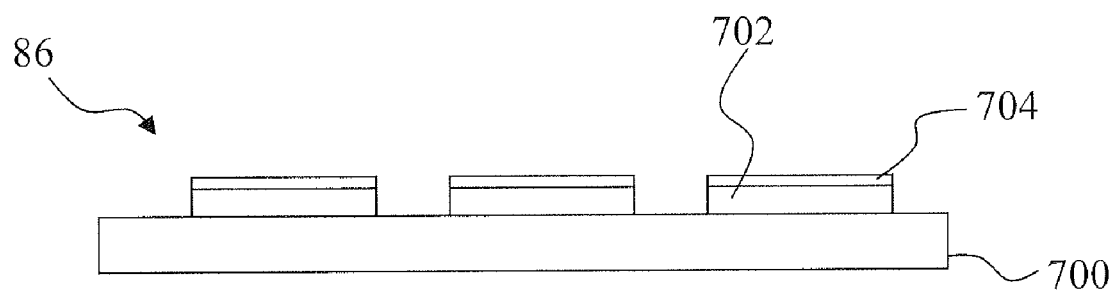
FIG. 25 is a side view of partially fabricated TFTs according to an embodiment of the invention.

Following etching step 608, patterned masking layer 706 is stripped in step 610 of FIG. 21, to form subassembly 86 as depicted in FIG. 25. Depending on the material used for masking layer 706, this could be done using a suitable solvent, or other similar techniques. A suitable process includes one that does not attack exposed substrate 700.

It should be realized however, that if a patterned silicon layer is applied, such as by printing techniques described above, steps 606 through 610 are not needed or are optional.

In step 612 of FIG. 21, silicon layer 704 is annealed, such as by a laser annealing process as described in step 306. Silicon layer 704 is annealed to improve the crystallinity of the silicon, and therefore the performance of the resulting transistor is improved. In one embodiment, a laser annealing process is performed such as described in U.S. Pat. No. 4,409,724, incorporated herein by reference. Suitable lasers can include, for example, eximer, YAG, and copper vapor lasers. In one embodiment, fiducial markers can also be created with the laser, or alternatively, printed, embossed, or laminated on the silicon film or the substrate.

In some embodiments of the invention, a cleaning step is performed to silicon layer 704 prior to depositing gate dielectric layer 708. This clean can include a suitable procedure, such as, for example, an HF clean, followed by $UV/O_2$ or $UV/O_2/F_2$ process to form a thin, high quality $SiO_2$ interface between Si and the deposited gate dielectric. This interface improves electrical performance between the Si and the deposited gate dielectric.

Figure 26:
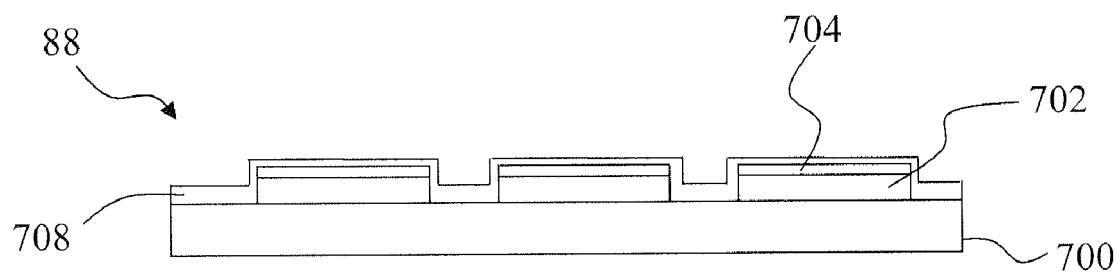
FIG. 26 is a side view of partially fabricated TFTs according to an embodiment of the invention.

In step 614 of FIG. 21, a gate dielectric layer 708 is deposited on silicon layer 704 using techniques as described in step 308, to form subassembly 88 as depicted in FIG. 26. Gate dielectric layer 708 can comprise, for example, materials such as silicon dioxide, silicon nitride, hafnium oxide and other suitable dielectric materials for fabricating TFTs and combinations of these materials. Gate dielectric layer 708 can be deposited by low temperature deposition means such as CVD, PECVD, sputtering (DC), liquid phase deposition or similar techniques, similar to the processes described in steps 110 and 308, with or without masking layers. In an alternative embodiment, gate dielectric layer 708 can be deposited using a printing or coating technique such as jetting systems like inkjet, gravure, or flexography, depending on the material used. In still other embodiments liquid phase deposition (LPD) is used to deposit suitable dielectric material such as $HFO_2$ or $SiO_2$. In various embodiments dielectric layer 708 is between about 0 and about 300 nm thick, in one embodiment dielectric layer 708 is between about 0 and about 50 nm thick. In this way, step 614 of method 600 of FIG. 21 creates a lower threshold voltage in the resultant device, which increases flexibility and efficiency in application and reduces power consumption.

Figure 27:
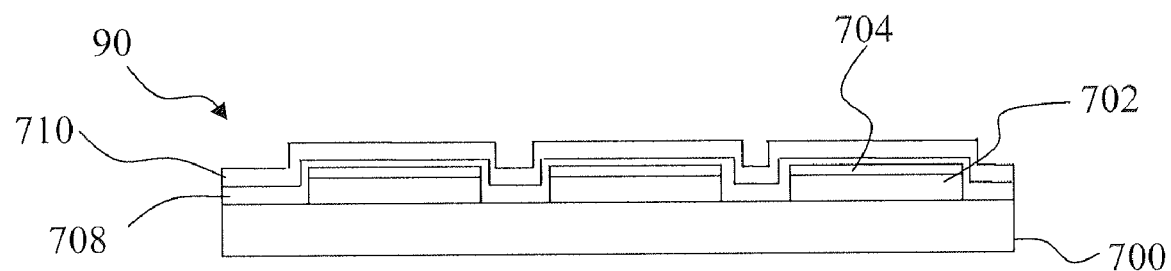
FIG. 27 is a side view of partially fabricated TFTs according to an embodiment of the invention.

In step 616 of FIG. 21, gate electrode layer 710 is deposited on gate dielectric layer 708, using techniques and materials as described in step 316 above, to form subassembly 90 as depicted in FIG. 27. Gate electrode layer 710 can comprise a highly conductive material, such as, for example, gold, platinum, silver, nickel, titanium, cobalt, chromium, tungsten, aluminum, silicon, doped silicon, conductive polymers, alloys of these materials, and any of a variety of highly conductive materials and combinations thereof. Gate electrode layer 710 can be deposited using any of a variety of techniques, such as CVD, PECVD, PVD, thermal transfer, printing processes such as, for example, gravure, jetting systems such as ink jet, flexography, lithography, screen printing, and any of a variety of suitable printing techniques and combinations thereof. In a particular embodiment, sputter deposition, such as DC sputter coating, pulse DC sputter coating, or RF sputter coating, is utilized to deposit gate electrode layer 710. In various embodiments, gate electrode layer 710 is between about 0 and about 1000 nm thick. More specifically, in a particular embodiment, gate electrode layer 710 is between about 20 and about 200 nm thick.

Figure 28:
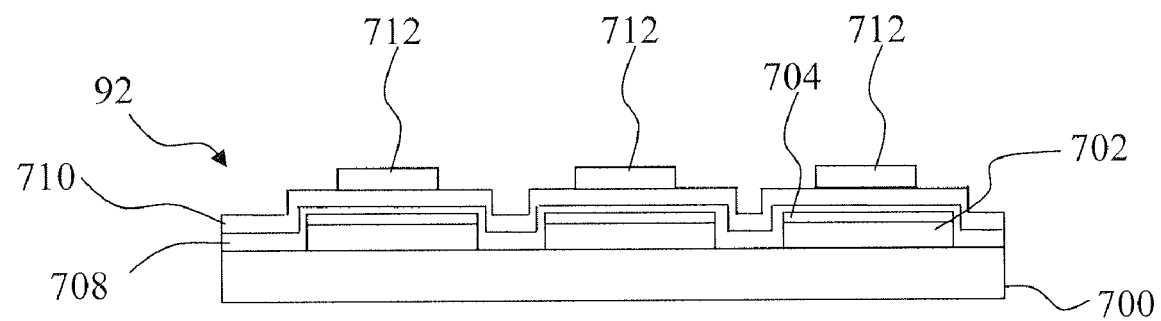
FIG. 28 is a side view of partially fabricated TFTs according to an embodiment of the invention.

In step 618 of FIG. 21, a masking layer 712 is deposited on gate electrode layer 710 to form subassembly 92 as depicted in FIG. 28. Masking layer 712 can be deposited using any of a variety of printing techniques such as, for example, gravure, jetting systems such as ink jet, flexography, lithography, screen printing, and any of a variety of suitable printing techniques and combinations thereof. In one embodiment, a wet masking layer 712 is printed on gate electrode layer 710. In another embodiment, standard photolithography processes are utilized to deposit and define masking layer 712. Alternatively, laser ablation can be used in place of a masking layer. For example, using a direct write method, a laser is focused to selectively ablate gate electrode layer 710 and optionally gate dielectric layer 708, such that no masking layer is needed. In a projection system, a patterned glass mask is place over the gate electrode layer. A laser is generally applied to the entire area, and the laser ablates any of gate electrode layer 710 and optionally underlying gate dielectric layer 708 where laser light can pass through the glass mask.

Figure 29:
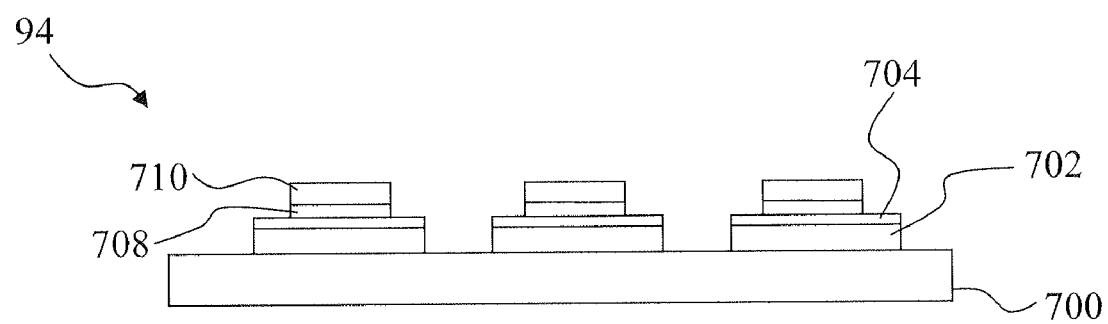
FIG. 29 is a side view of partially fabricated TFTs according to an embodiment of the invention.

In step 620 of FIG. 21, gate dielectric layer 708 and gate electrode layer 710 layers are etched to form subassembly or transistor assembly 94 as depicted in FIG. 29. The layers can be etched using processes such as wet etch, etching pastes, and any other suitable etch process. In one embodiment, gate dielectric layer 708 and gate electrode layer 710 are both etched using a wet etch process. It is this step where gate electrode layer 710 acts as a mask to self-align gate with the regions that will act as source and drain electrodes of the transistor.

It is realized that if one or both of gate dielectric layer 708 and gate electrode layer 710 are selectively deposited so as to form a patterned layer, step 620 may not be needed.

Figure 30:
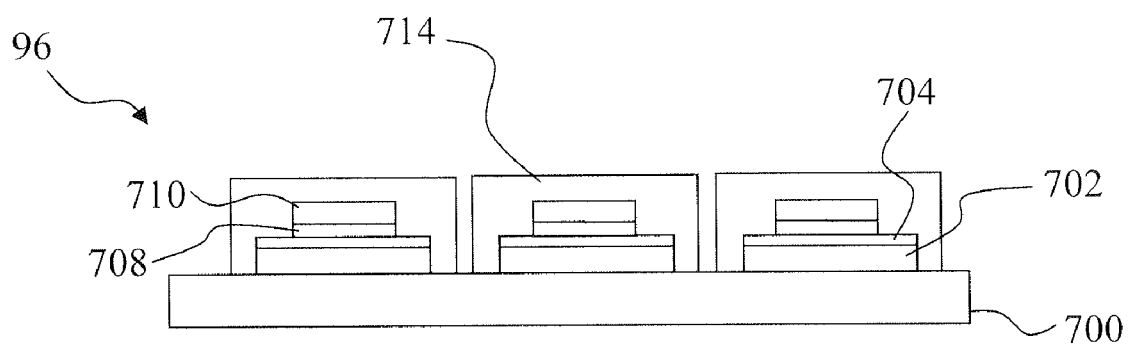
FIG. 30 is a side view of partially fabricated TFTs according to an embodiment of the invention.

In step 622 of FIG. 21, at least one dopant material 714, such as an N-type dopant or a P-type dopant, is deposited on the exposed surface of subassembly 94 to form subassembly 96 as depicted in FIG. 30. In one embodiment of the invention, this step is accomplished by blanket coating one or more layers of boron or phosphorous by PECVD. In another embodiment, dopant material 714 is applied by utilizing various print techniques such as gravure, jetting system (e.g. ink jet), screen printing or flexography or is spray deposited. In one embodiment, the dopant material is a spin on dopant that may be printed or deposited by other means. In one embodiment, a layer of dopant material 714 about 5 μm thick is deposited, more particularly about 1 μm thick, and more particularly about 0.2 μm thick.

Figure 30A:
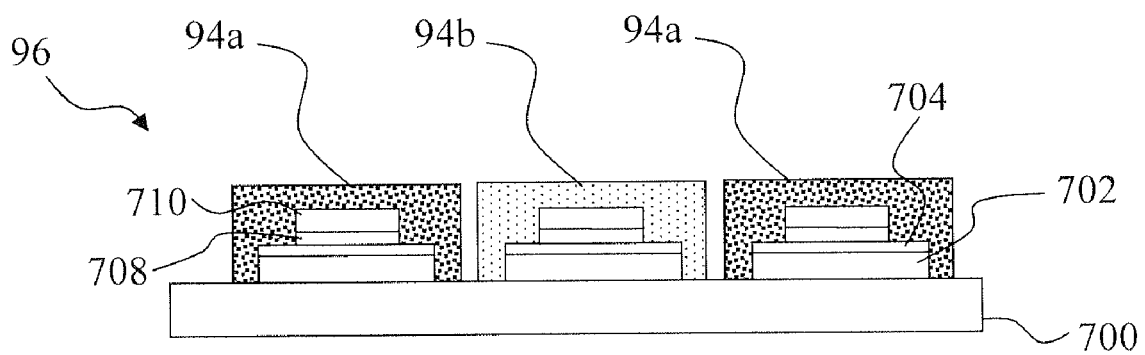
FIG. 30A is a side view of partially fabricated TFTs according to an alternative embodiment of the invention from FIG. 30.

Alternatively in step 622 of FIG. 21, an N-type dopant, such as a spin-on dopant, may be deposited on at least one transistor, and a P-type dopant, such as a spin-on dopant, may be deposited on at least one other transistor to form subassembly 96 as illustrated in FIG. 30. More typically, a plurality of transistors 94a can have an N-type dopant deposited on the exposed surfaces and a plurality of transistors 94b can have a P-type dopant deposited on the exposed surfaces as a means for creating CMOS circuits, as illustrated in FIG. 30a.

Dopant material 714 is laser processed in step 624 resulting in doping of the underlying silicon in the source, drain and gate regions of the transistor but not in the channel region. This is accomplished by melting silicon layer 704 and silicon layer 710 using the laser and driving dopant material 714 into the film to form source 715 and drain 717. There is no or little presence of dopant material in channel region 719 of the device as the dopant material is not in intimate contact with the silicon in channel region 719 and therefore has very low possibility of diffusing into channel region 719. Alternatively the GILD process can be used to selectively dope the Si areas.

In one example embodiment, phosphorous is used as the dopant material, and is doped up to about $1 \times 10^{21}$ atoms/cm$^2$, for a sheet resistance of about 200 ohms. In another embodiment of the invention, boron is used as the dopant material, and is dope up to about $2 \times 10^{20}$ atoms/cm$^2$ for a sheet resistance of about 12,000 ohms.

Figure 31:
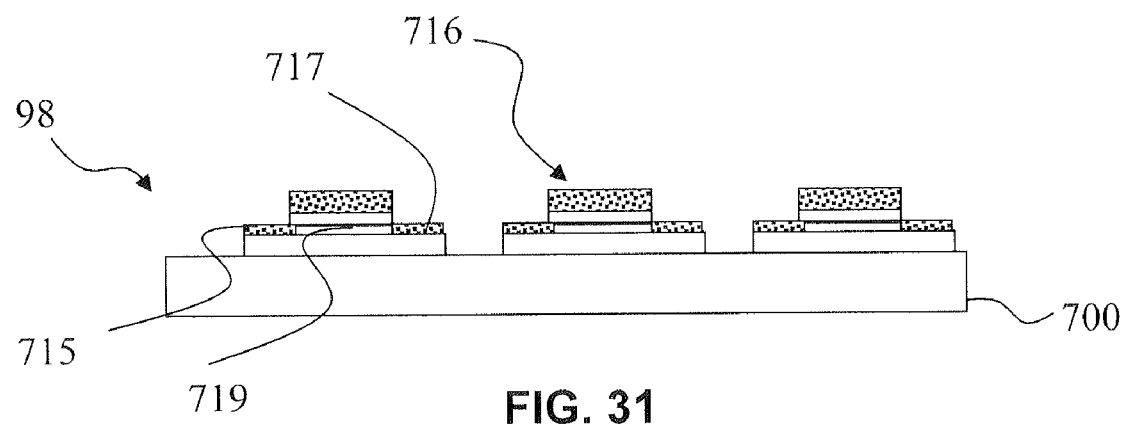
FIG. 31 is a side view of partially fabricated TFTs according to an embodiment of the invention.

Dopant material 714 is stripped in step 626 of FIG. 21 to form subassembly 98 in FIG. 31. This can be done by any suitable means, such as, for example, a water rinse, a wet clean using appropriate chemicals, a heat step in vacuum to evaporate the dopant or a clean using gases in a vacuum system. Completion of steps 622 through 626 results in a structure 716 where the gate is automatically aligned with the source 715 and drain 717 electrodes as the gate "shadows" channel area 719. In a matrix of TFTs, such as on a web, all or only some of the TFTs can be doped.

In step 628 of FIG. 21, contacts to source, drain and gate are printed using suitable materials known in the art. In various embodiments materials such as gold, platinum, silver, nickel, titanium, cobalt, chromium, tungsten, aluminum, alloys of these materials and the like, may be used to form contacts.

In certain embodiments of method 600, at least one of the TFTs in a matrix is doped with N-type to create NMOS structures, and at least one other of the TFTs is doped with P-type to create PMOS structures. In various embodiments, a dopant of the first type, such as N-type, is applied in step 622 to a plurality of subassemblies, followed by a dopant of a second type, such as P-type, applied in step 622 to a separate plurality of subassemblies, before the laser processing step 624 is performed. After the doping step 624 is performed, any excess dopant is removed in step 626.

In an alternative embodiment, a dopant of the first type, such as N-type, is applied in step 622 to a plurality of subassemblies, which is then followed by laser processing step 624. A dopant of a second type, such as P-type, is applied in step 622 to a separate plurality of subassemblies, which is then followed by a second laser processing step 624. Any excess dopant is removed in step 626 after each separate laser processing step, or after both laser processing steps are performed.

In this way, method 600 for creation of TFTs allows for flexibility in the application and doping of the various dopant types to create PMOS, NMOS and CMOS structures. An additional cleaning process, such as an HF process, may be needed in between doping sequences.

Further, an optional encapsulation layer can be added, similar to step 114 of method 100 to protect the resulting transistors. The encapsulation layer can be deposited by any of a variety of processes including a coating process such as slot die coating, curtain coating, spray coating and the like, a printing process such as flexography, screen printing, gravure, or jetting systems such as inkjet, a deposition process such as CVD, PVD, or PECVD, or a lamination process. Any combination of these processes can be used as well, and the transistor can comprise multiple encapsulation layers. In one embodiment, the encapsulation layer can comprise a polymer material, such as, for example, polyimide.

An annealing step may be performed after any or all of the deposition steps or after the transistor structure is completely formed in order to improve the transistor performance. This could be a thermal anneal in a controlled environment or in the presence of a plasma such as a hydrogen plasma.

Printing plates used in any of the above printing processes, such as printing of any of the transistor components, and/or printing of masking layers for any of the etching or patterning processes, can be formed by one or more methods as described in U.S. Patent Application Publication No. 2008/0092377 entitled "Patterned Printing Plates And Processes For Printing Electrical Elements." Such printing plates can result in higher quality surface morphology, and/or tighter tolerances of the printed design. Furthermore, traditional photolithography techniques can be used in any of the etching steps described above.

Systems for accomplishing the above described methods and techniques can include any number and combination of tool sets as contemplated by one of ordinary skill in the art.

In one embodiment, referring to any of steps 302 through 306 of FIG. 10, any of steps 502 and 504 of FIG. 20, or any of steps 602 and 604 of FIG. 21 can be performed in a deposition system (hereinafter "System 1"), such as a single rotary drum comprising at least one deposition vacuum chamber, and a laser annealing chamber. In an exemplary embodiment, the rotary drum system can comprise a first deposition chamber for sputter coating the substrate with a barrier layer, a second deposition chamber for sputter coating a silicon layer, and a laser annealing chamber for crystallizing areas of the silicon layer.

In another embodiment, step 308 of FIG. 10, step 514 of FIG. 20, or step 614 of FIG. 21 can be performed in a dielectric deposition system (hereinafter "System 2") comprising at least one cleaning station, such as an HF cleaning station, and a deposition chamber for depositing the gate dielectric layer in series. The cleaning and deposition processes can be performed in the same or separate systems.

In another embodiment, step 310 of FIG. 10, step 506 of FIG. 20, or step 606 of FIG. 21 can be performed using a masking layer printer system ("System 3"). For example, such masking layer printer system can comprise a single printing station such as an inkjet or gravure station. In another example, the printer system comprises at least two masking layer printing stations in series to minimize the possibilities of pinholes in the masking layer material. Optional cure stations can be placed in masking layer printer systems, such as after the single printing station, or between and after the plurality of printing stations in the multiple printing station system.

In another embodiment, steps 312 and 314 of FIG. 10, steps 508, 510, and/or 518 of FIG. 20, or steps 608 and 610, and/or 620 can be performed in an etching system ("System 4") comprising at least one etching station, followed by an optional masking layer stripping station. The etching stations can comprise wet etching, dry etching, etching pastes, and combinations thereof. In one example, an HF etching station is followed by a KOH etching station, followed by a second HF etching station, followed by a solvent-based masking layer stripping station, to accomplish a three-step etching process as described above in step 312 of FIG. 10. One or more optional rinsing stations and/or one or more optional drying stations can be placed between and after each etching station and masking layer stripping station.

In another embodiment, step 316 of FIG. 10, step 516 of FIG. 20, or step 616 of FIG. 21 can be accomplished via a gate electrode printer system ("System 5"). Such system can comprise, for example, a single printing station, such as an inkjet or gravure station, followed by one or more curing stations. Alternatively, a system resembling System 3 can also be used.

In another embodiment, step 518 of FIG. 20 or step 620 of FIG. 21 can be performed using either a single station wet bath ("System 6") or can be combined with the etching and doping system described as follows. Steps 320 and 322 of FIG. 10, steps 522 and 524 of FIG. 20, or steps 622 and 624 of FIG. 21 can be combined in a single etching and doping system ("System 7") comprising a first etching station such as an HF etching station, a dopant deposition station, such as a PECVD station, followed by one or more laser doping stations.

In another embodiment, step 324 of FIG. 10, step 526 of FIG. 20, or step 626 of FIG. 21 can be accomplished using a single station wet bath with optional drying ("System 8"). Alternatively, a system resembling the System 4 can be used described above.

In another embodiment, the repetition of steps 320 through 324 of FIG. 10, steps 520 through 526 of FIG. 20, or steps 622 through 626 of FIG. 21 can be performed in System 7 itself, or as its own system. The advantages of having its own system include throughput advantages (for web-based operations, no need to perform multiple passes), and to avoid cross-contamination of dopant types when using opposite dopant types.

The methods of the present invention can be accomplished in a single apparatus comprising at least Systems 1, 2, 3, 4, and 7.

The invention therefore addresses and resolves many of the deficiencies and drawbacks previously identified. The invention may be embodied in other specific forms without departing from the essential attributes thereof; therefore, the illustrated embodiments should be considered in all respects as illustrative and not restrictive.

What is claimed is:
1. A method for forming self-aligned silicon thin film transistors comprising:
providing a generally flexible substrate;
depositing a barrier material on at least a portion of the flexible substrate;
forming at least one silicon assembly on at least a portion of the barrier material, each silicon assembly comprising silicon;
cleaning the at least one silicon assembly using a cleaning technique including UV/O$_2$, UV/O2/F2, wet clean, and combinations thereof, thereby forming a SiO$_2$ interface on at least a portion of the at least one silicon assembly;
depositing a dielectric material on a least a portion of the SiO$_2$ interface to form a gate dielectric, wherein the dielectric material can be deposited by utilizing a low temperature technique including chemical vapor deposition (CVD), plasma-enhanced CVD (PECVD), sputter deposition, DC sputter deposition, pulsed DC sputter deposition, RF sputter deposition, electron beam evaporation, liquid phase deposition, printing and combinations thereof;
depositing a gate electrode material on at least a portion of the gate dielectric;
selectively patterning the gate electrode material and the dielectric material to form at least one transistor assembly;

selectively doping areas of the at least one transistor assembly thereby forming a source and a drain by:
introducing a doping material to the at least one transistor assembly,
laser annealing pre-selected portions of the silicon assembly such that at least some doping material is transferred into the silicon, and
removing any excess doping material not transferred into the silicon to form a self-aligned silicon thin film transistor.

2. The method of claim 1, wherein the barrier material is deposited utilizing a low temperature technique selected from the group consisting of chemical vapor deposition (CVD), plasma-enhanced CVD (PECVD), sputter deposition, DC sputter deposition, pulsed DC sputter deposition, RF sputter deposition, electron beam evaporation, liquid phase deposition, printing and combinations thereof.

3. The method of claim 1, wherein the gate electrode comprises a highly conductive material selected from the group consisting of gold, platinum, silver, nickel, titanium, cobalt, chromium, tungsten, aluminum, silicon, doped silicon, conductive polymers, alloys of these materials, and combinations thereof.

4. The method of claim 1, wherein the gate electrode is deposited by chemical vapor deposition (CVD), plasma-enhanced CVD (PECVD), PVD, DC sputter deposition, pulsed DC sputter deposition, RF sputter deposition, electron beam evaporation, thermal transfer or printing.

5. The method of claim 1, selectively doping areas of the at least one transistor assembly comprises:
introducing a first dopant material to a first portion of a first transistor assembly of the at least one transistor assembly;
introducing the first dopant material to a second portion of the first transistor assembly;
laser annealing the first transistor assembly such that the first dopant material is transferred into the first portion to form the source, and the first dopant material is transferred into the second portion to form the drain wherein a third portion of the first transistor assembly is positioned between the first portion and the second portion and under the gate electrode layer such that the first dopant material is not introduced into the third portion, thereby forming a channel; and
removing any excess first dopant material.

6. The method of claim 1, wherein selectively doping areas of the at least one transistor assembly includes:
depositing a first dopant material on at least one of the at least one transistor assemblies, and
laser annealing to dope the source, the drain, and the gate electrode.

7. The method of claim 1, wherein the barrier material comprises a spin-on glass material patterned by a printing technique selected from the group consisting of a jetting system, gravure, flexography, screen printing, and combinations thereof.

8. The method of claim 1, wherein forming at least one silicon assembly comprises:
depositing a silicon film on at least one of the flexible substrate and the barrier material;
cleaning the silicon film; and
laser annealing the silicon film.

9. The method of claim 1, further comprising:
printing contacts to the source, gate electrode, and the drain.

10. The method of claim 1, further comprising:
depositing a protective layer over the gate electrode before selectively doping.

11. The method of claim 2, wherein the barrier material is deposited by a printing technique selected from the group consisting of flexography, a jetting system, gravure, screen printing, and combinations thereof, to form a patterned barrier layer.

12. The method of claim 3, wherein the gate electrode comprises doped silicon.

13. The method of claim 4, further comprising:
patterning the gate electrode by
printing a masking layer over the gate electrode material to form masked areas and unmasked areas,
etching the gate electrode material in the unmasked areas, and
removing the masking layer, thereby forming a patterned gate electrode.

14. The method of claim 5, wherein the first dopant material is introduced to the first portion and the second portion simultaneously, and then the first portion and second portion are laser annealed to simultaneously form the source, the drain, and the channel.

15. The method of claim 5, wherein the first dopant material is introduced to the first transistor assembly by selectively printing the first dopant material to form the first portion and the second portion, and the first transistor assembly is generally laser annealed.

16. The method of claim 5, wherein the at least one transistor assembly comprises at least the first transistor assembly and a second transistor assembly, the method further comprising:
introducing a second dopant material to a first portion of the second transistor assembly;
introducing the second dopant material to a second portion of the second transistor assembly;
laser annealing the second transistor assembly such that the second dopant material is transferred into the first portion to form a source, and the second dopant material is transferred into the second portion to form a drain wherein a third portion of the second transistor assembly is positioned between the first portion and the second portion and under the gate electrode layer such that the second dopant material is not introduced into the third portion, thereby forming a channel; and
removing any excess second dopant material.

17. The method of claim 6, wherein the first dopant material is blanket deposited on the at least one of the at least one transistor assemblies, and the first dopant material is selectively laser annealed to dope the source, the drain, and the gate electrode.

18. The method of claim 6, wherein the first dopant material is selectively deposited on the at least one of the at least one transistor assemblies, and the first dopant material is generally annealed to dope the source, the drain, and the gate electrode.

19. The method of claim 6, wherein the at least one transistor assembly comprises at least the first transistor assembly and a second transistor assembly, and wherein selectively doping areas of the at least one transistor assembly further comprises:
depositing a second dopant material on a second transistor assembly of the least one transistor assembly, and
laser annealing the second transistor assembly to dope the source, the drain and the gate electrode.

20. The method of claim 16, wherein laser annealing is performed after both the first dopant material and the second dopant are introduced to the first transistor assembly and second transistor assembly respectively.

21. The method of claim 16, wherein the first dopant material is introduced to the first transistor assembly and laser annealed before the second dopant material is introduced and laser annealed to the second transistor assembly.

22. The method of claim 16, wherein at least one of the first and second dopant materials is introduced to the at least one transistor assembly by a printing technique selected from the group consisting of a jetting system, gravure, flexography, screen printing, and combinations thereof.

23. The method of claim 16, wherein the first dopant material comprises an N-type dopant, and the second dopant material comprises a P-type dopant.

24. The method of claim 8, further comprising:
selectively printing a masking layer material over a portion of the silicon film to define masked areas and unmasked areas of the silicon film;
etching the unmasked areas of silicon film; and
removing the masking layer material to form the at least one silicon assembly.

* * * * *